United States Patent
Shin et al.

(10) Patent No.: US 11,848,313 B2
(45) Date of Patent: Dec. 19, 2023

(54) DISPLAY APPARATUS HAVING DISPLAY MODULE AND MANUFACTURING METHOD THEREOF

(71) Applicant: SAMSUNG ELECTRONICS CO., LTD., Suwon-si (KR)

(72) Inventors: Seonghwan Shin, Suwon-si (KR); Sungsoo Jung, Suwon-si (KR); Pilyong Oh, Suwon-si (KR); Kwangjae Lee, Suwon-si (KR); Jeongin Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 403 days.

(21) Appl. No.: 17/134,837

(22) Filed: Dec. 28, 2020

(65) Prior Publication Data
US 2021/0202449 A1    Jul. 1, 2021

(30) Foreign Application Priority Data
Dec. 27, 2019   (KR) ......................... 10-2019-0176603

(51) Int. Cl.
*H01L 25/075*   (2006.01)
*H01L 33/48*    (2010.01)
(Continued)

(52) U.S. Cl.
CPC ........ *H01L 25/0753* (2013.01); *H01L 33/483* (2013.01); *H01L 33/58* (2013.01);
(Continued)

(58) Field of Classification Search
CPC combination set(s) only.
See application file for complete search history.

(56) References Cited

U.S. PATENT DOCUMENTS

2010/0060553 A1   3/2010  Zimmerman et al.
2015/0054008 A1*  2/2015  Rhee .................. H01L 25/0753
                                                257/89
(Continued)

FOREIGN PATENT DOCUMENTS

CN    110208957 A    9/2019
CN    110600459 A    12/2019
(Continued)

OTHER PUBLICATIONS

International Search Report dated Apr. 19, 2021 issued by the International Searching Authority in counterpart International Application No. PCT/KR2020/018761 (PCT/ISA/210).
(Continued)

*Primary Examiner* — Mark W Tornow
*Assistant Examiner* — Priya M Rampersaud
(74) *Attorney, Agent, or Firm* — Sughrue Mion, PLLC

(57) ABSTRACT

Provided is a display module including a substrate including a mounting surface, a side surface, and a chamfer portion formed between the mounting surface and the side surface, a plurality of inorganic light emitting diodes mounted on the mounting surface and each including a pair of electrodes electrically connected to the substrate, a black matrix arranged between the plurality of inorganic light emitting diodes, and a cover bonded to the mounting surface and configured to cover the mounting surface, wherein the pair of electrodes are oriented in a direction opposite to a direction in which the plurality of inorganic light emitting diodes emits light, and the cover is provided to extend outward of the side surface in an extension direction of the mounting surface.

18 Claims, 14 Drawing Sheets

(51) Int. Cl.
  *H01L 33/58* (2010.01)
  *H01L 33/62* (2010.01)
  *G02B 1/11* (2015.01)
  *G02B 5/30* (2006.01)

(52) U.S. Cl.
  CPC ............... *H01L 33/62* (2013.01); *G02B 1/11* (2013.01); *G02B 5/3025* (2013.01); *H01L 2933/0066* (2013.01)

(56) References Cited

U.S. PATENT DOCUMENTS

| | | |
|---|---|---|
| 2017/0047393 A1 | 2/2017 | Bower et al. |
| 2018/0190631 A1* | 7/2018 | Kim ...................... G06F 3/1446 |
| 2019/0122592 A1* | 4/2019 | Han ...................... G09F 9/3026 |
| 2019/0200422 A1 | 6/2019 | Kim et al. |
| 2019/0305073 A1* | 10/2019 | Chen .................... H10K 59/121 |
| 2019/0319168 A1 | 10/2019 | Kim |
| 2020/0235075 A1* | 7/2020 | Tsai ...................... H01L 33/483 |
| 2020/0285271 A1* | 9/2020 | Huang ................ G02F 1/13336 |

FOREIGN PATENT DOCUMENTS

| | | |
|---|---|---|
| EP | 3 343 273 A2 | 7/2018 |
| JP | 2002-297065 A | 10/2002 |

OTHER PUBLICATIONS

Communication dated May 21, 2021 issued by the European Intellectual Property Office in counterpart European Application No. 20215354.0.
Communication dated May 4, 2022 by the European patent Office in counterpart European Patent application No. 20215354.0.
Office Action dated Mar. 20, 2023, issued by European Patent Office in European Patent Application No. 20215354.0.

* cited by examiner

DISPLAY APPARATUS HAVING DISPLAY MODULE AND MANUFACTURING METHOD THEREOF

CROSS-REFERENCE TO RELATED APPLICATION

This application claims priority to Korean Patent Application No. 10-2019-0176603 (filed on Dec. 27, 2019), filed in the Korean Intellectual Property Office, the disclosures of which are incorporated by reference herein in their entirety.

BACKGROUND

1. Field

The disclosure relates to a display apparatus for displaying an image by coupling modules each having self-emissive inorganic light emitting diodes mounted on a substrate thereof.

2. Description of the Related Art

A display apparatus is a type of an output device that visually displays data information, such as characters and figures, images, and the like. For a display apparatus, a liquid crystal panel using a backlight, or an Organic Light-Emitting Diode (OLED) panel formed of an organic compound film that emits light by itself in response to an electric current have been used.

SUMMARY

It is an object of the disclosure to provide a display apparatus and a method of manufacturing the same, and specifically, a display module suitable for a large sized display, a display apparatus having the same, and a method of manufacturing the same.

Additional aspects of the disclosure will be set forth in part in the description which follows and may be learned by practice of the disclosure.

According to an aspect of the disclosure, there is provided a display module including: a substrate including a mounting surface, a side surface, and a chamfer portion formed between the mounting surface and the side surface; a plurality of inorganic light emitting diodes mounted on the mounting surface and each including a pair of electrodes electrically connected to the substrate; a black matrix arranged between the plurality of inorganic light emitting diodes; and a cover bonded to the mounting surface and configured to cover the mounting surface, wherein the pair of electrodes are oriented in a direction opposite to a direction in which the plurality of inorganic light emitting diodes emits light, and the cover is provided to extend outward of the side surface in an extension direction of the mounting surface.

The cover may include a first region arranged outside of the mounting surface in the extension direction of the mounting surface and a second region arranged on the mounting surface.

The cover may include a first layer at an outermost side of the display module in a direction in which the mounting surface faces, a second layer arranged behind the first layer, and an adhesive layer arranged behind the second layer to bond the cover to the mounting surface.

The first layer may include at least one of an anti-glare layer or an anti-reflect layer.

The second layer may include a light transmission control layer configured to lower a light transmittance.

The second layer may include a circular polarization layer.

The second layer may be formed to be transparent, and the adhesive layer may include an opaque material to lower a light transmittance.

An outermost end of the cover in the extension direction of the mounting surface may include an inclined surface inclined with respect to the side surface, and a length of a cross section of an upper side of the cover in a direction in which the mounting surface faces is larger than a length of a cross section of a lower side of the cover in the direction in which the mounting surface.

The cover may further include a light absorbing layer configured to cover the inclined surface of the outermost end of the cover in the extension direction of the mounting surface and including a light absorbing material.

The side surfaces may be provided to correspond to four edges of the mounting surface, and the cover may be provided to extend outward of the four side surfaces corresponding to the four edges of the mounting surface in the extension direction of the mounting surface.

Each of the inorganic light emitting diodes may be provided as a LED flip chip.

Each of the inorganic light emitting diodes may include a light emitting surface formed in the direction in which the mounting surface faces and a bottom surface formed at a side opposite to the light emitting surface, and the pair of electrodes may be arranged on the bottom surface.

According to another aspect of the disclosure, there is provided a display apparatus including a display module array in which a plurality of display modules are arranged in a M×N matrix, wherein each of the display modules includes: a substrate including a mounting surface, a side surface, and a chamfer portion formed between the mounting surface and the side surface; a plurality of inorganic light emitting diodes mounted on the mounting surface and each including a pair of electrodes electrically connected to the substrate; a black matrix arranged between the plurality of inorganic light emitting diodes; and a cover bonded to the mounting surface and configured to cover the mounting surface, wherein the pair of electrodes are oriented in a direction opposite to a direction in which the plurality of inorganic light emitting diodes emits light, and the cover is provided to extend outward of the side surface in an extension direction of the mounting surface such that at least a portion of the cover is arranged between a gap formed between the plurality of display modules.

The plurality of display modules may include a first display module and a second display module arranged adjacent to the first display module, and a length of the gap in the extension direction of the mounting surface may be provided to be larger than a length of a separation between a cover of the first display module and a cover of the second display module.

The outermost ends of the covers of the first display module and the second display module in a direction in which the first display module and the second display module are adjacent to each other may be formed as inclined surfaces inclined with respect to the side surfaces of the first and second display modules, and a separation distance in the extension direction of the mounting surface between an upper side of the cover of the first display module in a direction in which the mounting surface faces and an upper side of the cover of the second display module in the direction in which the mounting surface faces is shorter than a separation distance in the extension direction of the mounting surface between a lower side of the cover of the first display module in the direction in which the mounting surface faces and a lower side of the cover of the second display module in the direction in which the mounting surface faces.

The separation distance in the extension direction of the mounting surface between the lower side of the cover of the first display module in the direction in which the mounting surface faces and the lower side of the cover of the second display module in the direction in which the mounting surface faces is shorter than a distance of the gap between the first display module and the second display module in the extension direction of the mounting surface.

The inclined surfaces of the covers of the first and second display modules may have an inclination angle smaller than an inclination angle of the chamfer portions of the first and second display modules.

The cover may include: a first layer arranged at an outermost side of the display module in a direction in which the mounting surface faces and including at least one of an anti-glare layer or an anti-reflect layer; a second layer arranged behind the first layer; and an adhesive layer arranged behind the second layer to bond the cover to the mounting surface.

The side surfaces may be provided to correspond to four edges of the mounting surface, and the cover may be provided to extend outward of the four side surfaces corresponding to the four edges of the mounting surface in the extension direction of the mounting surface.

Each of the inorganic light emitting diodes may include a light emitting surface formed in the direction in which the mounting surface faces and a bottom surface formed at a side opposite to the light emitting surface, and the pair of electrodes may be arranged on the bottom surface.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
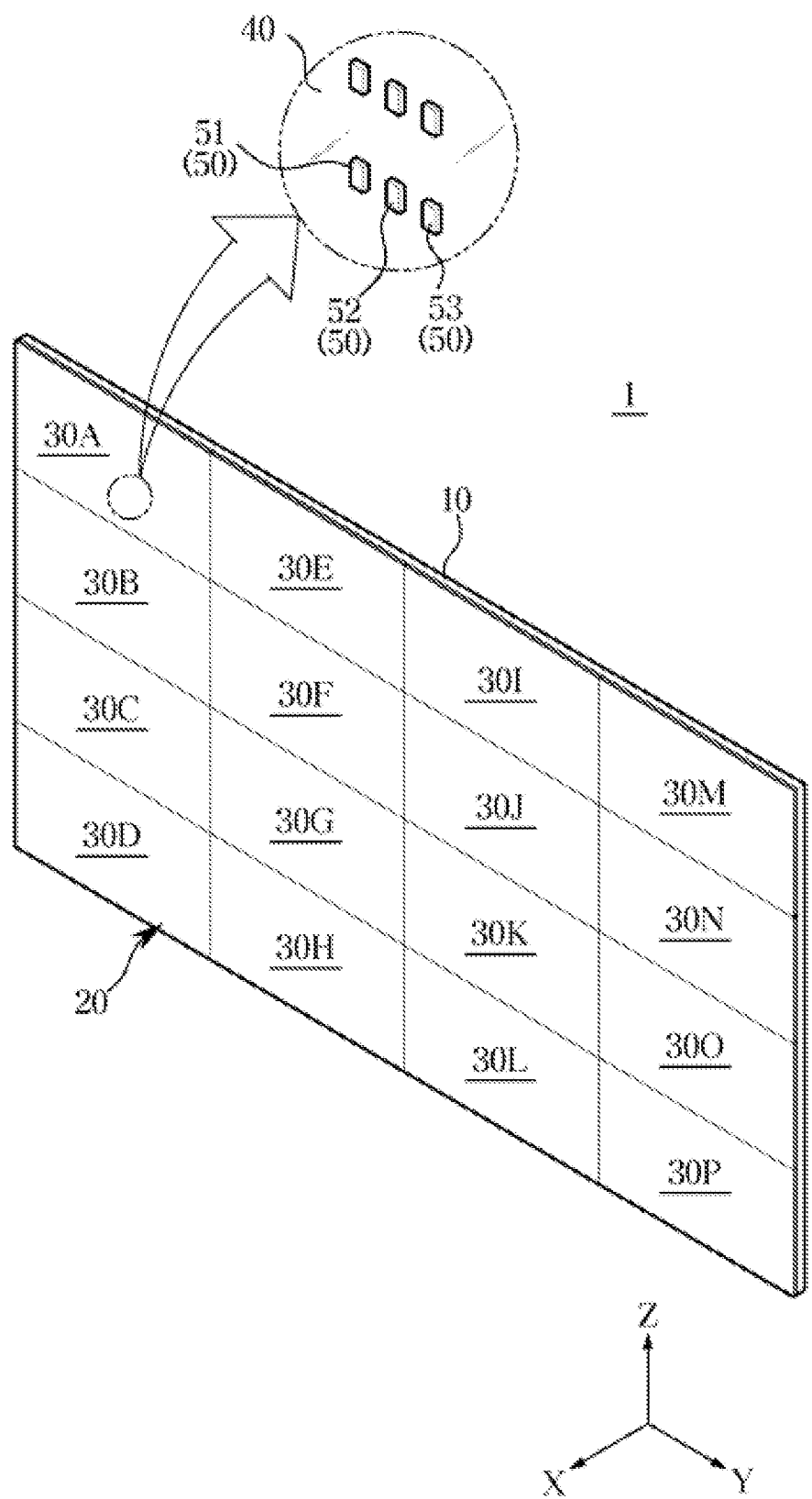
FIG. 1 is a view illustrating a display apparatus according to an embodiment of the disclosure.

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art.

In the following description, it is to be understood that the singular forms "a," "an," and "the" include plural references unless the context clearly dictates otherwise. In order to make the description of the disclosure clear, unrelated parts are not shown and, the sizes of components are exaggerated for clarity.

It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

In addition, the meaning of "identical" in the specification may include having similar properties or similarity within a certain range. In addition, the "identical" refers to "substantially identical". It should be understood that the meaning of "substantially identical" refers to a value that falls within an error range in manufacturing or a value having a difference within a range that does not have a significance with respect to a reference value.

Embodiments of the disclosure relate to a display apparatus for displaying an image by coupling modules each having self-emissive inorganic light emitting diodes mounted on a substrate thereof.

As previously described, a liquid crystal panel requiring a backlight, or an Organic Light-Emitting Diode (OLED) panel formed of an organic compound film that emits light by itself in response to an electric current have been mainly used. However, the liquid crystal panel has a slow response time and large power consumption, and requires a backlight due to limitation on emitting light by itself, having a difficulty in providing the display apparatus in a compact size. In contrast, since the OLED panel does not require a backlight due to emitting light by itself, slim thickness is achieved. However, the OLED panel has a shorter life than a liquid crystal panel due to using the same organic material, and is susceptible to a burn-in phenomenon, in which when the same screen is displayed for a long time, a specific part of the screen remains seen even when the screen is switched due to the life of sub-pixels being ended.

It may be advantageous, therefore, to replace the LCD panel and the OLED panel with a micro light emitting diode (micro LED or μLED) panel that mounts an inorganic light emitting device on a substrate and uses the inorganic light emitting device itself as a pixel.

Micro light-emitting diode display panel (hereinafter, referred to as a micro LED panel) is one of flat panel display panels and includes a plurality of inorganic light-emitting diodes (inorganic LEDs) each having a size of 100 micrometers or less.

Such an LED panel is a self-emissive device but is not susceptible to OLED burn-in as an inorganic light-emitting device, and has excellent brightness, resolution, power consumption, and durability.

Compared to the LCD panels that require backlighting, micro LED display panels provide better contrast, response time, and energy efficiency. OLEDs and micro-LEDs (i.e., inorganic LEDs) are both energy efficient, but micro LEDs have excellent brightness, luminous efficiency, and lifespan compared to OLEDs.

In addition, the micro LEDs may achieve a substrate-level display modulation by arranging LEDs on a circuit board in units of pixels, and provide various resolutions and screen sizes of display according to the customer's order.

Hereinafter, embodiments according to the disclosure will be described in detail with reference to the accompanying drawings.

Figure 2:
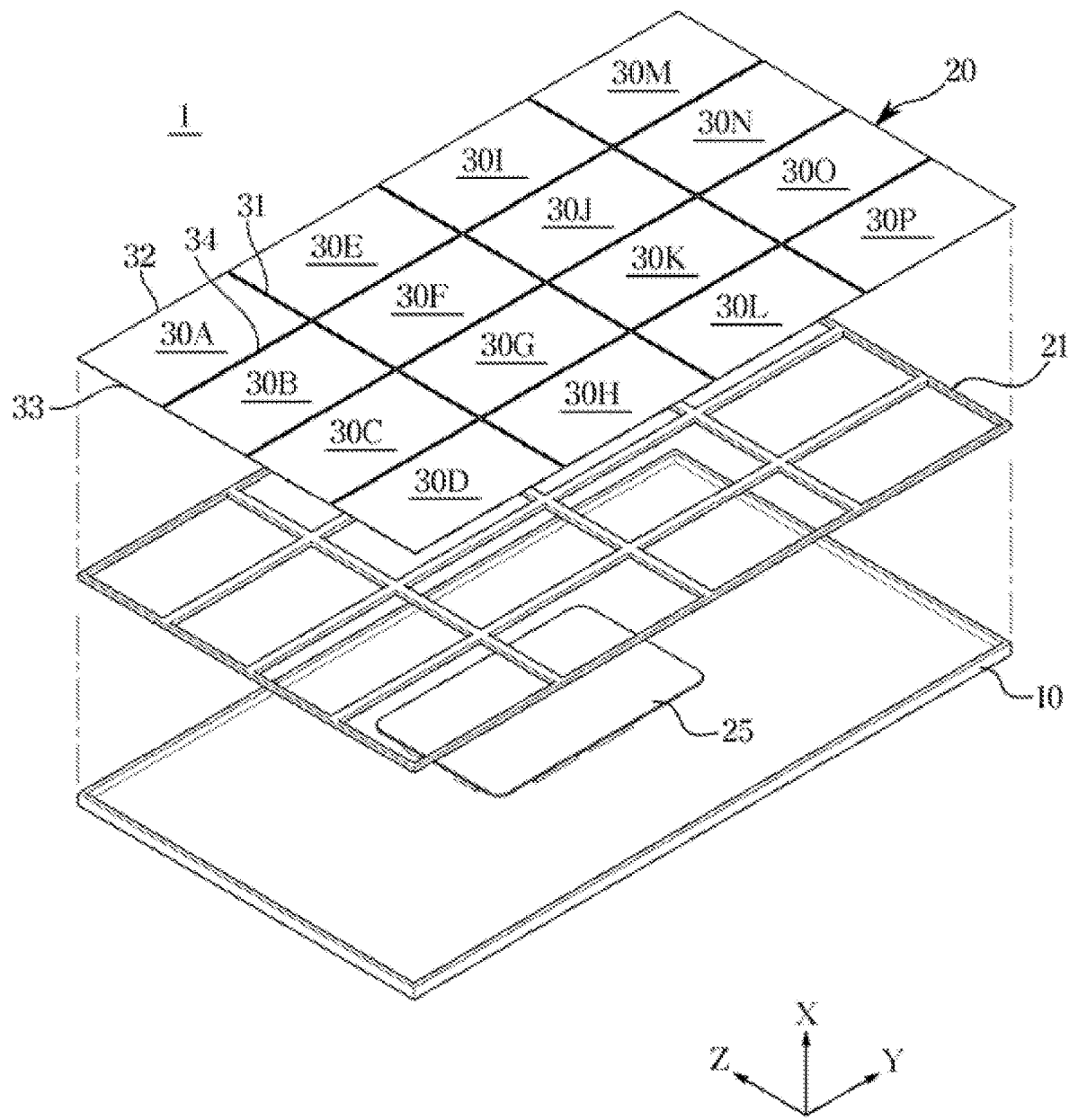
FIG. 2 is an exploded view illustrating main components of the display apparatus shown in FIG. 1.
Figure 3:
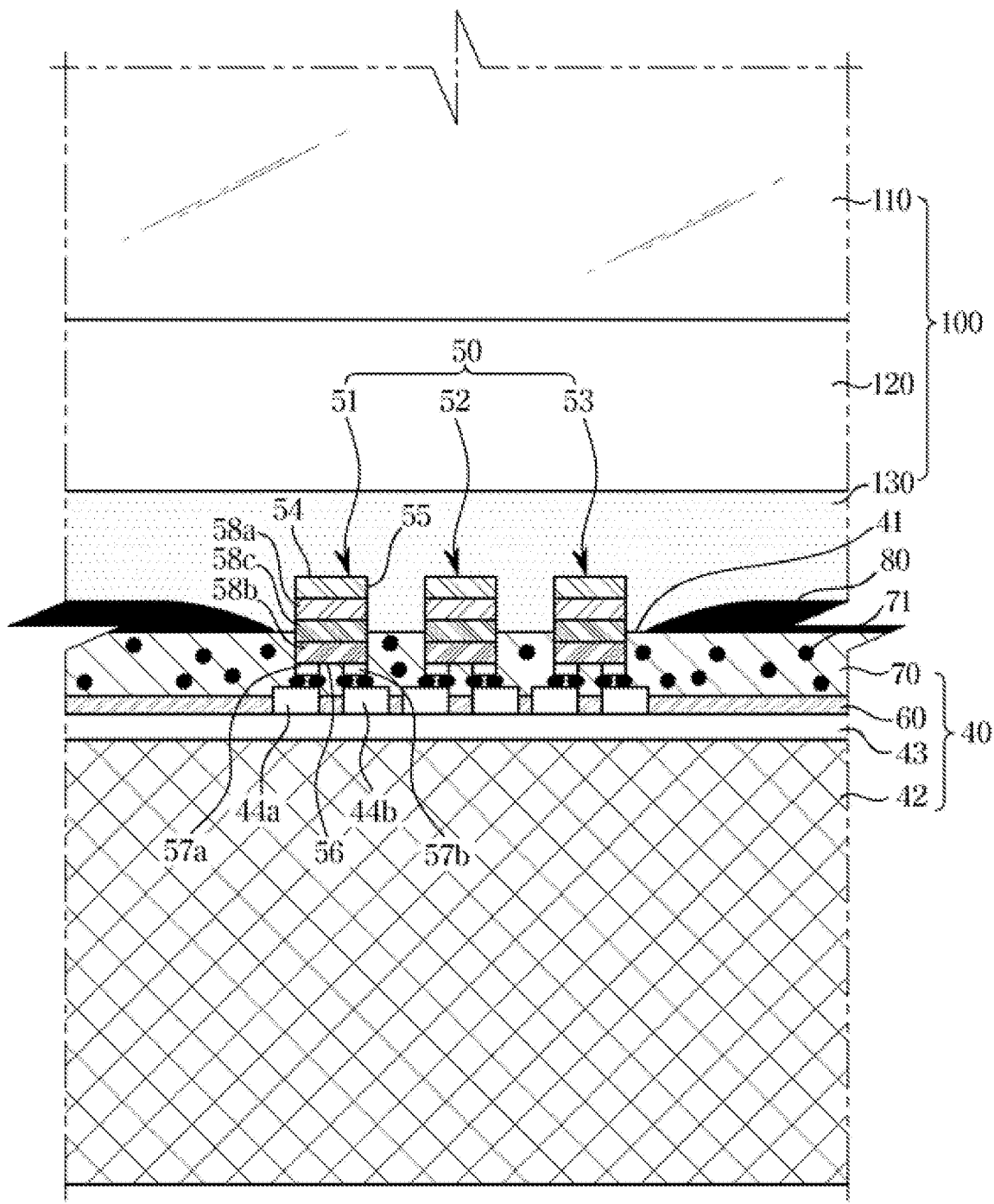
FIG. 3 is an enlarged cross-sectional view illustrating one or more components shown in FIG. 1.
Figure 4:
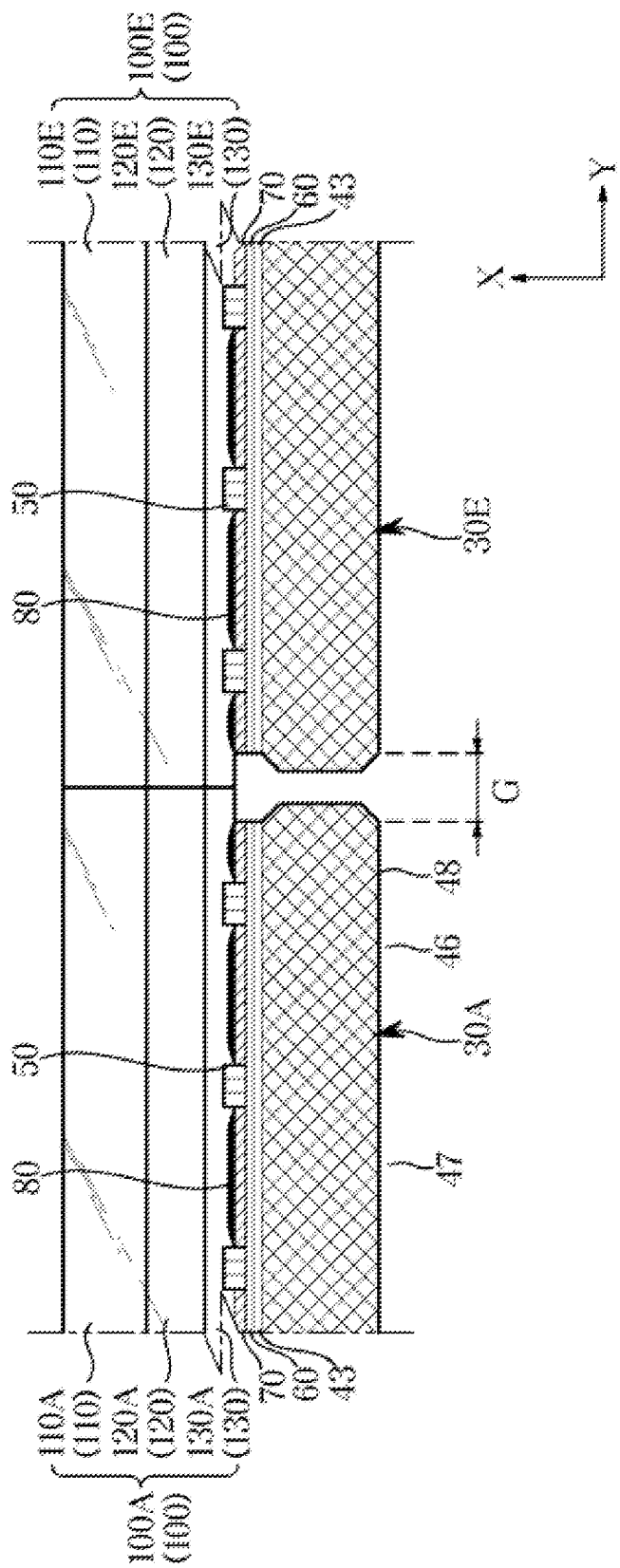
FIG. 4 is a cross-sectional view illustrating one or more components of the display apparatus shown in FIG. 1.

Referring now to FIGS. 1-4, FIG. 1 is a view illustrating a display apparatus according to one or more embodiments of the disclosure, FIG. 2 is an exploded view illustrating main components of the display apparatus shown in FIG. 1, FIG. 3 is an enlarged cross-sectional view illustrating one or more components shown in FIG. 1, and FIG. 4 is a cross-sectional view illustrating one or more components of the display apparatus shown in FIG. 1.

In the following description, components of a display apparatus 1 including a plurality of inorganic light emitting diodes 50 shown in the drawings are components in microunits having a size of several μm to several hundreds of μm, and the sizes of some components (a plurality of inorganic light emitting diodes 50, a black matrix 80, e.g., a black matrix, etc.) shown in the drawings may be exaggerated for the sake of convenience of description.

The display apparatus 1 is a device that displays information, material, data, etc. as characters, figures, graphs, images, etc., and may be implemented as a television (TV), a personal computer (PC), a mobile, a digital signage, etc.

According to one or more embodiments of the disclosure, the display apparatus 1 includes a display panel 20 displaying an image, a power supply device supplying power to the display panel 20, a main board 25 controlling the overall operation of the display panel 20, a frame 21 supporting the display panel 20, and a rear cover 10 covering a rear surface of the frame 21.

The display panel 20 may include a plurality of display modules 30A to 30P, a driving board for driving each of the display modules 30A to 30P, and a Timing Controller (TCON) board generating a timing signal required for controlling each of the display modules 30A to 30P.

The rear cover 10 may support the display panel 20. The cabinet 10 may be installed on the floor through a stand, or may be installed on a wall through a hanger.

The plurality of display modules 30A to 30P may be arranged in upper and lower side directions and left and right side directions to be adjacent to each other. The plurality of display modules 30A to 30P may be arranged in an M×N matrix form. In one or more embodiments, the display modules 30A to 30P are provided as sixteen display modules 30A to 30P and are arranged in a 4×4 matrix form, but there is no limitation on the number and arrangement method of the plurality of display modules 30A to 30P.

The plurality of display modules 30A to 30P may be installed on the frame 21. The plurality of display modules 30A to 30P may be installed on the frame 21 through various known methods, such as magnetic force using a magnet or a mechanical fitting structure. The rear cover 10 is coupled to the rear of the frame 21, and the rear cover 10 may form the rear appearance of the display apparatus 1.

As described above, the display apparatus 1 according to one or more embodiments of the disclosure may implement a large screen by tiling the plurality of display modules 30A to 30P.

According to one or more embodiments of the disclosure, in the plurality of display modules 30A to 30P, each single display module may be applied to a display apparatus. The display modules 30A to 30P may be individually installed on an electronic product or a machine part, such as a wearable device, a portable device, a handheld device, and other various displays that require various displays, or may be assembled in a matrix form as in one or more embodiments and used for a display apparatus, such as a monitor for a PC, a high-definition TV and signage, and an electronic display.

The plurality of display modules 30A to 30P may have the same configuration. Therefore, the description of any one display module described below may be equally applied to all other display modules.

One of the plurality of display modules 30A to 30P, for example, the first display module 30A may be formed in a quadrangle type. Alternatively, the first display module 30A may be provided in a rectangular type or a square type.

Accordingly, the first display module 30A may include edges 31, 32, 33, and 34 formed in the upper and lower side direction and the left and right side directions with respect to a first direction X, which is the forward direction.

Referring to FIG. 3, each of the plurality of display modules 30A to 30P may include a substrate 40 and a plurality of inorganic light emitting diodes 50 mounted on the substrate 40. The plurality of inorganic light emitting diodes 50 may be mounted on a mounting surface 41 of the substrate 40 facing in the first direction X.

The substrate 40 may be formed in a quadrangle type. As described above, the plurality of display modules 30A to 30P may be formed in a quadrangle shape, and the substrate 40 may be formed in a quadrangle shape to correspond to each display module.

The substrate 40 may be provided in a rectangular shape or a square shape.

Therefore, taking the first display module 30A as an example, the substrate 40 may include four edges corresponding to the edges 31, 32, 33, and 34 of the first display module 30A formed in the upper and lower side directions and in the left and right side directions with respect to the first direction X, which is the forward direction.

The substrate 40 may include a base substrate 42 and a thin film transistor (TFT) layer 43 formed on the base substrate 42 to drive the inorganic light emitting diodes 50. The base substrate 42 may include a glass substrate. The substrate 40 may include a chip on glass (COG) type substrate. The substrate 40 may include first and second pad electrodes 44a and 44b provided to electrically connect the inorganic light emitting diodes 50 to the TFT layer 43.

A TFT constituting the TFT layer 43 is not limited to a specific structure or type, and may be configured in various embodiments. The TFT of the TFT layer 43 according to an embodiment of the disclosure may be implemented not only as a Low Temperature Poly Silicon (LTPS) TFT, an oxide TFT, or a polysilicon or a-silicon (Si) TFT, but also as an organic TFT, a graphene TFT, or the like.

In addition, when the base substrate 42 of the substrate 40 is formed of a silicon wafer, the TFT layer 43 may be replaced by a Complementary Metal-Oxide Semiconductor (CMOS) type transistor or an n-type or p-type Metal-Oxide Semiconductor Field Effect Transistor (MOSFET).

The plurality of inorganic light emitting diodes 50 may include inorganic light emitting diodes formed of an inorganic material and having a width, a length, and a height, each of several micrometers (μm) to several hundreds of μm. The micro-inorganic light emitting device may have a short side of 100 μm or less among the width, the length, and the height. The inorganic light emitting device 50 may be picked up from a sapphire or silicon wafer and transferred directly onto the substrate 40. The plurality of inorganic light emitting diodes 50 may be picked up and transported through an electrostatic method using an electrostatic head or a stamp method using an elastic polymer material, such as polydimethylsiloxane (PDMS) or silicon, as a head.

The plurality of inorganic light emitting diodes 50 is a light emitting structure including an n-type semiconductor 58a, an active layer 58c, a p-type semiconductor 58b, a first contact electrode 57a, and a second contact electrode 57b.

One of the first contact electrode 57a and the second contact electrode 57b may be electrically connected to the n-type semiconductor 58a, and the other is provided to be electrically connected to the p-type semiconductor 58b.

The first contact electrode 57a and the second contact electrode 57b may be connected in the form of a controlled collapse chip connection, or "flip chip," to be deposed parallel with each other while facing in the same direction (a direction opposite to the light emission direction).

The inorganic light emitting device 50 includes a light emitting surface 54 deposed to face in the first direction X when mounted on the mounting surface 41, a side surface 55, and a bottom surface 56 deposed at a side opposite to the light emitting surface 54, and the first contact electrode 57a and the second contact electrode 57b may be formed on the bottom surface 56.

The contact electrodes 57a and 57b of the inorganic light emitting device 50 may be disposed on a side opposite to the light emitting surface 54 to be disposed at a side opposite and facing away the light emission direction.

Therefore, when light generated from the active layer 58c is emitted in the first direction X through the light emitting surface 54, the light may be emitted in the first direction X without interfering with the first contact electrode 57a or the second contact electrode 57b.

The first contact electrode 57a and the second contact electrode 57b may be electrically connected to the first pad electrode 44a and the second pad electrode 44b formed at a side of the mounting surface 41 of the substrate 40, respectively.

As will be described below, the inorganic light emitting device 50 may be directly connected to the pad electrodes 44a and 44b through a bonding configuration, such as an anisotropic conductive layer 70 or solder, rather than through other configurations.

The anisotropic conductive layer 70 may be formed on the substrate 40 to mediate electrical bonding between the contact electrodes 57a and 57b and the pad electrodes 44a and 44b. The anisotropic conductive layer 70 may represent an anisotropic conductive adhesive attached on a protective film, and have a structure in which conductive balls 71 are scattered in an adhesive resin. The conductive balls 71 may be conductive spheres surrounded by a thin insulating film, and when the insulating film is broken by a pressure, electrical connection occurs between conductors.

The anisotropic conductive layer 70 may include an anisotropic conductive film (ACF) in the form of a film and an anisotropic conductive paste (ACP) in the form of a paste.

Therefore, when the plurality of inorganic light emitting diodes 50 are mounted on the substrate 40, a pressure applied to the anisotropic conductive layer 70 causes the insulating film of the conductive balls 71 to be broken, so that the contact electrode 57a and 57b of the inorganic light emitting device 50 may be electrically connected to the pad electrodes 44a and 44b of the substrate 40.

However, the plurality of inorganic light emitting diodes 50 may be mounted on the substrate 40 through a solder instead of the anisotropic conductive layer 70. The inorganic light emitting device 50 may be aligned on the substrate 40 first, and then the inorganic light emitting device 50 may be subject to a reflow process to be bonded to the substrate 40.

The plurality of inorganic light emitting diodes 50 may include a red light emitting device 51, a green light emitting device 52, and a blue light emitting device 53, and the light emitting devices 50 may be mounted on the mounting surface 41 of the substrate 40 in a series of the red light emitting devices 51, the green light emitting devices 52, and the blue light emitting devices 53 as one unit. A series of the red light emitting devices 51, the green light emitting devices 52, and the blue light emitting devices 53 may form one pixel. In this case, the red light emitting device 51, the green light emitting device 52, and the blue light emitting device 53 may each form a sub-pixel.

The red light emitting device 51, the green light emitting device 52, and the blue light emitting device 53 may be arranged in a line at predetermined intervals as in one or more embodiments of the disclosure, or may be arranged in a different shape, such as a triangular shape.

The substrate 40 may include a light absorbing layer 60 to improve the contrast by absorbing external light. The light absorbing layer 60 may be formed at a side of the mounting surface 41 of the substrate 40 as a whole. The light absorbing layer 60 may be formed between the TFT layer 43 and the anisotropic conductive layer 70.

The plurality of display modules 30A to 30P may further include a black matrix 80 formed between the plurality of inorganic light emitting diodes 50.

The black matrix 80 may perform a function of supplementing the light absorbing layer 60 entirely formed at a side of the mounting surface 41 of the substrate 40. The black matrix 80 absorbs external light and allows the substrate 40 to appear one or more colors, such as black, to improve the contrast of the screen. It may be appreciated that the black matrix 80 may be substantially any color to improve contrast of the screen.

In one or more embodiments, the black matrix 80 is formed to be deposed between pixels each formed by a series of the red light emitting devices 51, the green light emitting devices 52, and the blue light emitting devices 53. In one or more embodiments, the black matrix 80 may be formed at a higher precision and partition each of the light emitting devices 51, 52, and 53, which are sub-pixels.

The black matrix 80 may be formed in a grid shape having a horizontal pattern and a vertical pattern to be disposed between pixels.

The black matrix 80 may be formed by applying a light-absorbing ink on the anisotropic conductive layer 70 through an ink-jet process and curing the light-absorbing ink, or by coating a light-absorbing film on the anisotropic conductive layer 70.

On the anisotropic conductive layer 70 formed entirely on the mounting surface 41, the matrices 80 may be formed gaps between the plurality of inorganic light emitting diodes 50 in which the plurality of inorganic light emitting diodes 50 are not mounted.

The plurality of display modules 30A to 30P may include front covers 100 disposed on upper sides of the mounting surfaces 41 in the first direction X to cover the mounting surfaces 41 of the plurality of display modules 30A to 30P, respectively.

Referring to FIG. 4, the plurality of front covers 100 may be provided to be respectively formed on the upper sides of the plurality of display modules 30A to 30P in the first direction X.

Each of the plurality of display modules 30A to 30P may be assembled after individual front covers 100 are formed. When taking the first display module 30A and the second display module 30E as an example among the plurality of display modules 30A to 30P, a first front cover 100A may be bonded to the mounting surface 41 of the first display module 30A, and a second front cover 100E may be formed on the mounting surface 41 of the second display module 30E.

The front cover 100 may be provided to cover the substrate 40 and the front side of the mounting surface 41 to protect the substrate 40 from external force. As will be described below, the front cover 100 may reduce the revelation of a seam formed by a gap G formed between the plurality of display modules 30A to 30P, and improve color deviation between the plurality of display modules 30A to 30P.

Hereinafter, the front cover 100 will be described in detail.

Figure 5:
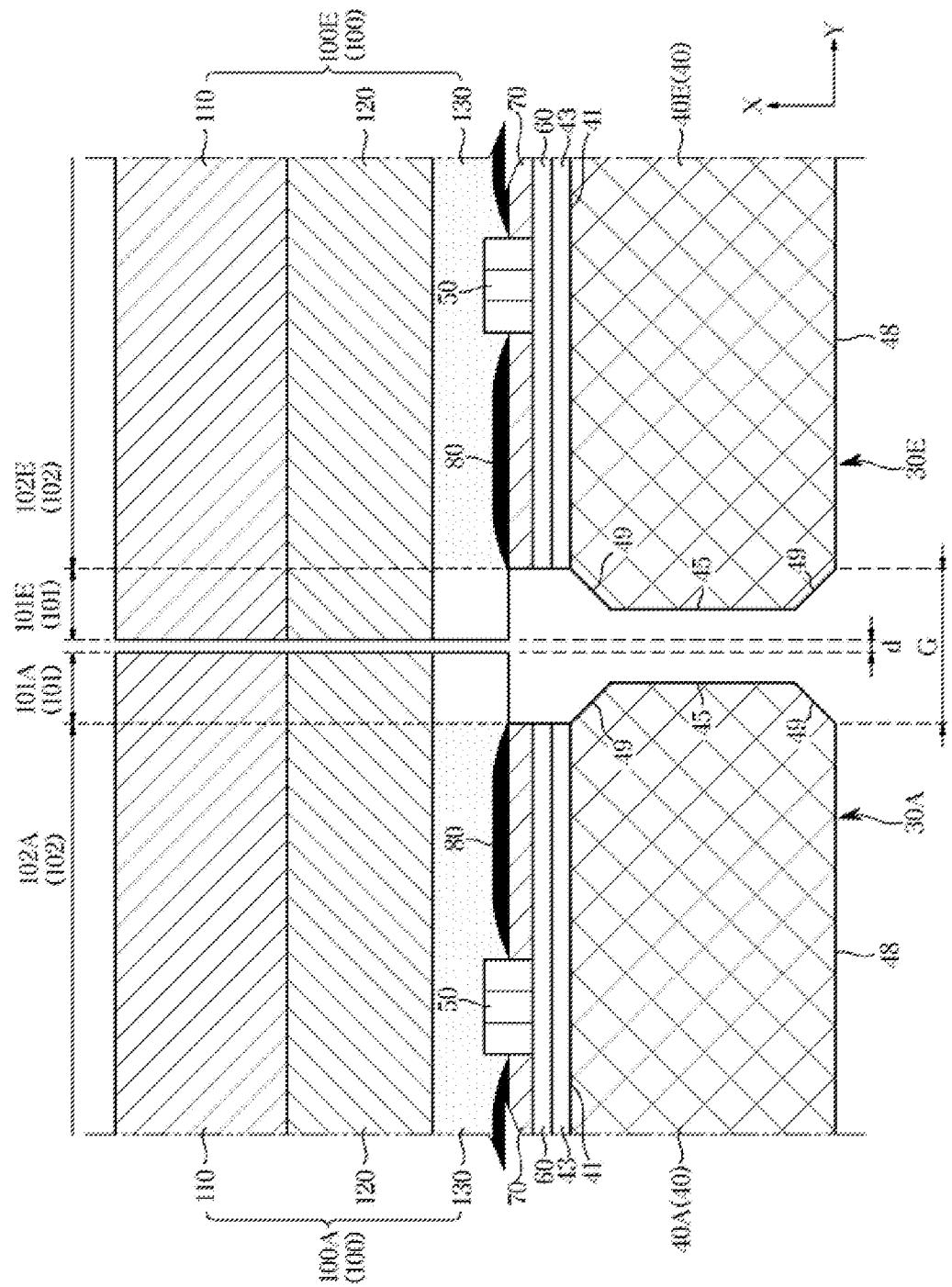
FIG. 5 is an enlarged view illustrating one or more other components shown in FIG. 4.

FIG. 5 is an enlarged cross-sectional illustrating other components shown in FIG. 4.

Since the plurality of display modules 30A to 30P are formed identical to each other, the plurality of display modules 30A to 30P will be described in relation to the first display module 30A.

It may be appreciated that the configuration of the plurality of display modules 30A to 30P may be described in relation to the display module 30, the substrate 40, and the front cover 100 as an example.

In addition, the first display module 30A and a second display module 30E disposed adjacent to the first display module 30A in a second direction Y among the plurality of display modules 30A to 30P will be described as needed.

In addition, since the plurality of display modules 30A to 30P is formed identical to each other, the front covers 100 formed on the plurality of display modules 30A to 30P will be described in relation to the first front cover 100A of the first display module 30A and the second front cover 100E of the second display module 30E as an example.

One of display manufacturing processes that implement a display panel using a display module is configured in a way to arrange a plurality of display modules adjacent to each other, form a single molding on the entire area of mounting surfaces of the plurality of display modules and gabs between the plurality of display modules, and form a light absorbing pattern on the molding, and collective form a single front cover on the light absorbing pattern.

Alternatively, another processing method is configured in a way to form a light absorbing pattern on a single front cover, and tile a plurality of display modules to match with the light absorbing pattern to arrange the light absorbing pattern between gaps between the plurality of display modules.

Alternatively, another processing method is configured in a way to form a light absorbing pattern configuration in advance when forming a light absorbing pattern on a molding or a front cover before tiling a plurality of display modules. According to one or more embodiments, the display apparatus 1 may be manufactured by bonding the front cover 100 to each of the plurality of display modules 30A to 30P before tiling the plurality of display modules 30A to 30P. In addition, in order to absorb light reflected from the gaps G between the plurality of display modules 30A to 30P, the front cover 100 of each of the plurality of display modules 30A to 30P may be formed to extend outside the substrate 40 of each of the plurality of display modules 30A to 30P.

Accordingly, when the plurality of display modules 30A to 30P are tiled, the front cover 200 extending from each of the display modules 30A to 30P is arranged in the gap G between the plurality of display modules 30A to 30P to absorb light transmitted to the gap G or light reflected from the gap G, thereby minimizing the perception of a seam.

Referring to FIG. 5, the front cover 100 may be provided to extend to the outside of the substrate 40 in the second direction Y.

The substrate 40 may include the mounting surface 41, a rear surface 48 formed parallel to the mounting surface 41, and the side surfaces 45 disposed between the mounting surface 41 and the rear surface 48.

The substrate 40 may include the chamfer portion 49 formed between the mounting surface 41 and the side surface 45 and between the rear surface 48 and the side surface 45.

The chamfer portion 49 may prevent each of the substrates from colliding and being damaged when the plurality of display modules 30A to 30P are arranged.

The front cover 100 may be provided to extend outward of the side surface 45 and the chamber portion 49 in the second direction Y perpendicular to the first direction X.

One or more embodiments of the disclosure may be described in relation to one edge of the substrate 40 corresponding to the right edge 31 of the first display module 30A, but the chamfer portions 49 and the side surfaces 45 may be formed on the other edges of the substrate 40 corresponding to the other edges 32, 33, and 34.

On the four edges 31, 32, 33, 34 of the first display module 30A or the four edges of the substrate 40, the opposite chamfer portions 49 may be disposed to be symmetrical and the opposite side surfaces 45 may be disposed to be symmetrical (see FIG. 2).

Accordingly, the front cover 100 may be provided to extend outward of the four edges of the substrate 40 in the second direction Y or a third direction Z perpendicular to the first direction X and the second direction Y.

The front cover 100 includes an anti-glare layer 110 disposed on the outermost side of the display module 30 in the first direction X and a light transmittance control layer 120 disposed behind the anti-glare layer 110.

Alternatively, as a configuration name, the anti-glare layer 110 and the light transmittance control layer 120 may be referred to as a first layer 110 and a second layer 120 when sequentially viewed from the front.

In addition, a layer disposed on the foremost surface of the front cover 100, such as an anti-reflect layer 150 or a front layer 160 disclosed in other embodiments of the disclosure to be described below, may be collectively referred to as a first layer together with the anti-glare layer 110, and a layer disposed behind the first layer, such as a circular polarization layer 140, may be collectively referred to as a second layer together with the light transmittance control layer 120.

The front cover 100 may include an adhesive layer 130 provided so that the front cover 100 including the anti-glare layer 110 and the light transmittance layer 120 is directly bonded to the mounting surface 41. The adhesive layer 130 may be disposed at the rearmost side of the front cover 100 in the first direction X.

However, the disclosure is not limited thereto, and the adhesive layer 130 may not be provided as a component of the front cover 100 but be provided as a component of the substrate 40 that is arranged on an upper surface of the mounting surface 41 in the first direction X such that the front cover 100 is bonded to the mounting surface 41.

The adhesive layer 130 may be formed of a transparent material through which light may be easily transmitted. In an implement, the adhesive layer 130 may be in a highly transparent state having a transmittance of 90% or more, such as an optically clear, or transparent, resin (OCR).

The OCRs may improve visibility and image quality by increasing transmittance through low-reflection properties. In a structure having an air gap, light loss occurs due to a difference in refractive index between a film layer and an air layer, but in a structure using an OCR, the difference in refractive index decreases, thereby reducing light loss and consequently improving visibility and image quality.

The OCR may improve image quality as well as protecting the substrate 40.

The adhesive layer 130 may be provided to have a predetermined height or higher in the first direction X in which the mounting surface 41 faces.

This is to sufficiently fill a gap that may be formed between the adhesive layer 130 and the plurality of inorganic light emitting diodes 50 when the adhesive layer 130 is bonded to the substrate 40.

In detail, the plurality of inorganic light emitting diodes 50 mounted on the mounting surface 41 are disposed to protrude than the mounting surface 41 in the first direction X, and thus uneven portions may be arranged in the second direction Y perpendicular to the first direction X on the mounting surface 41.

When the adhesive layer 130 is bonded to the substrate 40, a void region may be formed between the mounting surface 41 and the adhesive layer 130 due to the uneven portions. In order to fill the uneven portions on the mounting surface 41 formed by the plurality of inorganic light emitting diodes 50, the adhesive layer 130 needs to have a predetermined height or higher.

The adhesive layer 130 is bonded to the mounting surface 41 by being compression-hardened on the mounting surface 41, and in a process of the adhesive layer 130 being cured, a void region may be formed between the mounting surface 41 and the adhesive layer 130 due to the uneven portions, which may cause air bubbles to be formed.

However, when the adhesive layer 130 is formed at a certain height, the adhesive layer 130 may be formed even inside the uneven portions formed on the mounting surface 41 during the compression hardening, so that the adhesive layer 130 may be completely formed on the mounting surface 41 without leaving an empty space between the mounting surface 41 and the adhesive layer 130.

As described above, the adhesive layer 130 is closely bonded to the mounting surface 41 while protecting components on the mounting surface 41, so that the display module 30 may have the front cover 100 directly bonded to the substrate 40 without using an additional molding configuration formed between the front cover 100 and the substrate 40.

External light incident onto the display module 30 may sequentially pass through the anti-glare layer 110, the light transmittance layer 120, and the adhesive layer 130 to reach the substrate 40 and the gap G.

On the contrary, light reflected from the substrate 40 and the gap G may sequentially pass through the adhesive layer 130, the light transmittance layer 120, and the anti-glare layer 110 to exit the display panel 20.

The anti-glare layer 110 may be provided to diffusely reflect externally incident to prevent externally incident light from being regularly reflected and dazzling the user.

As light incident from the outside is diffusely reflected, a glare phenomenon may be reduced and the contrast of a screen displayed on the display panel 20 may be improved.

The light transmittance control layer 120 may be provided to reduce the transmittance of light incident from outside or the transmittance of external light reflected from the substrate 40 and the gap G.

The light transmittance control layer 120 according to one or more embodiments of the disclosure includes a material of a component that lowers the transmittance of light to allow at least a part of light to be transmitted through to the substrate 40, or absorb at least a part of light reflected from the substrate 40 and proceeding in the first direction X.

The light transmittance control layer 120 may be provided to have a transparency lower than that of the adhesive layer 130 in order to lower the transmittance of light. When a plurality of substrates are produced, some substrates may have different colors due to process errors during the production. Accordingly, substrates having different unique colors may be tiled to form a single display panel As described above, the light transmittance control layer 120 according to one or more embodiments of the disclosure absorbs at least a part of light reflected from the substrate 40 and transmitted to the outside, thereby increasing the sense of unity of the screen of the display panel 20.

The anti-glare layer 110 and the light transmittance control layer 120 may prevent external light incident onto the display panel 20 from being transmitted through to the substrate 40 or prevent external light reflected from the substrate 40 to be transmitted through to the outside of the display panel 20, thereby improving the contrast of the screen displayed on the display panel 20.

The front cover 100 may be disposed in front of the substrate 40 in the first direction X to improve the contrast that may be degraded by external light on the screen displayed on the display panel 20.

As described above, in the case of the display module 30 according to one or more embodiments of the disclosure, the front cover 100 may be provided to extend outward of the substrate 40 in the second direction Y.

Accordingly, a part of the light introduced into the gap G formed between the plurality of display modules 30A to 30P may be blocked by at least a part of the anti-glare layer 110 disposed in the gap G, and external light introduced into the gap G and then reflected in the gap G may be absorbed by at least a part of the light transmittance control layer 120 disposed in the gap G without being transmitted to the outside, so that the sense of unity of the screen displayed on the display panel 20 may be improved.

In detail, the front cover 100 includes a first region 101 disposed outside of the mounting surface 41 in the second direction Y or disposed in the gap G and a second region 102 disposed on the mounting surface 41.

The first region 101 and the second region 102 of the front cover 100 may be divided by the gap G.

Since the first region 101 of the front cover 100 is disposed in the gap G, external light directed to the gap G may be blocked by the first region 101 of the front cover 100, or light reflected from the gap G and then directed to the outside may be blocked by the first region 101 of the front cover 100 so that the revelation of a seam, which may be formed by the gap G that is a boundary between the plurality of display modules 30A to 30P, is reduced and the sense of unity of the display panel 20 is improved.

As described above, the front cover 100 may be provided to extend outside of the mounting surface 41 not only in the second direction Y but also in a direction opposite to the second direction Y.

The front cover 100 may be provided to extend outside of the four edges of the mounting surface 41.

Taking the first display module 30A and the second display module 30E as an example, the first region 101A of the first front cover 100A extending from the first display module 30A may be disposed in the gap G formed between the first display module 30A and the second display module 30E.

The gap G may be defined as an interval between the mounting surface 41 of the first display module 30A and the mounting surface 41 of the second display module 30E in the second direction Y.

Accordingly, the side surfaces 45 and the chamfer portions 49 of the first and second display modules 30A and 30E may be disposed in the gap G.

The second region 102A of the first front cover 100A may be disposed on the mounting surface 41 of the first display module 30A.

The first region 101E of the second front cover 100E extending from the second display module 30E may be disposed in the gap G formed between the first display module 30A and the second display module 30E, and the second region 102E of the second front cover 100E may be disposed on the mounting surface 41 of the second display module 30E.

In the gap G formed between the first display module 30A and the second display module 30E, the first regions 101A and 101E of the first and second front covers 100A and 100E may be arranged in parallel with each other in the second direction Y.

The first regions 101A and 101E of the first and second front covers 100A and 100E may each extend in the second direction Y or in a direction opposite to the second direction Y by a length less than half of the gap G.

Accordingly, when the first regions 101A and 101E of the first and second front covers 100A and 100E are arranged in parallel with each other in the second direction Y, a summation of the lengths of the first regions 101A and 101E of the first and second front cover 100A and 100E may be provided equal to or smaller than the length of the gap G in the second direction Y.

According to one or more embodiments of the disclosure, when the first regions 101A and 101E of the first and second front covers 100A and 100E are arranged in parallel with each other in the second direction Y, a predetermined separation d may exist between the first region 101A of the first front cover 100A and the first region 101E of the second front cover 100E.

However, the disclosure is not limited thereto, and the first display module 30A and the second display module 30E may be tiled without having a separation between the first region 101A of the first front cover 100A and the first region 101E of the second front cover 100E.

However, in an implementation, a predetermined separation d may exist between the first region 101A of the first front cover 100A and the first region 101E of the second front cover 100E.

As described above, in the gap G between the first display module 30A and the second display module 30E, the first regions 101A and 101E of the first and second front covers 100A and 100E may be arranged.

External light incident onto the display panel is transmitted through the first regions 101A and 101E of the first and second front covers 100A and 100E, by which the external light is diffusely reflected to the outside or is partially absorbed by the first regions 101A and 101E so that the amount of external light reaching the gap G is reduced and the revelation of the boundary between the first display module 30A and the second display module 30E due to the gap G may be reduced.

In addition, when light reflected from the gap G and directed to the outside of the display panel 20 is transmitted through the first regions 101A and 101E of the first and second front covers 100A and 100E, the light is diffusely reflected outside of the display panel 20 or partially absorbed by the first regions 101A and 101E, and thus the amount of the light transmitted to the outside of the display panel 20 is reduced and the revelation of the boundary between the first display module 30A and the second display module 30E due to the gap G may be reduced.

Such a configuration may reduce the amount of external light introduced into the gap G formed between the plurality of display modules 30A to 30P while absorbing at least part of external light reflected from the gap G, so that the sense of unity of the screen of the display panel 20 may be improved.

Additionally, even when the substrate 40A of the first display module 30A and the substrate 40E of the second display module 30E are provided to have different colors, and each of the substrates 40A and 40E is displayed to the outside by reflection of external light, at least a part of the reflected light is absorbed by a corresponding one of the first and second front covers 100A and 100E, so that the unique color of each of the substrates 40A and 40E is not perceived to the outside, and the sense of unity of the screen may be improved.

Hereinafter, a method of manufacturing a display apparatus according to an embodiment of the disclosure will be briefly described in conjunction with FIGS. 1 to 5.

Figure 6:
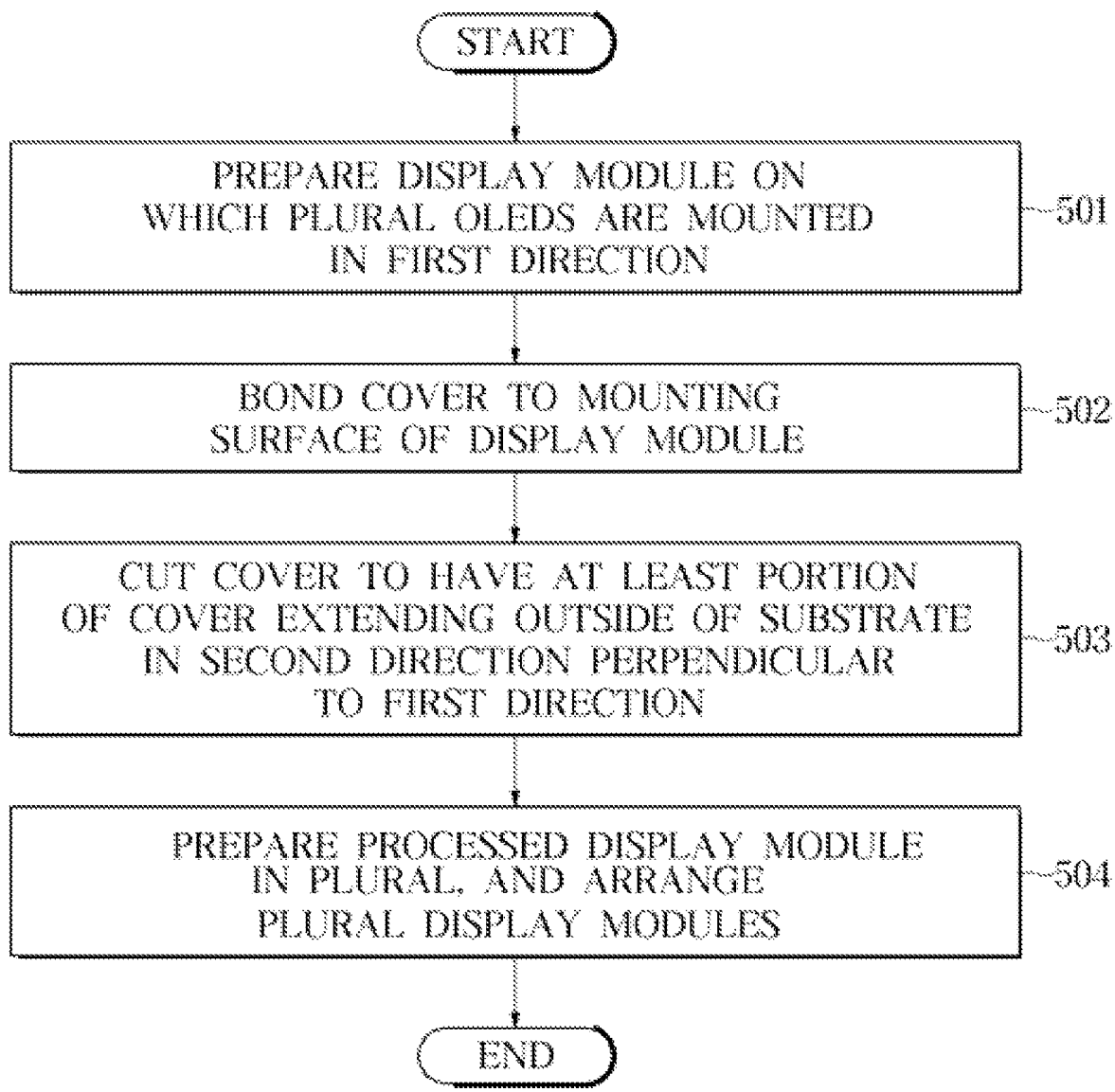
FIG. 6 is a flowchart showing a method of manufacturing a display apparatus according to an embodiment of the disclosure.

FIG. 6 is a flowchart showing a method of manufacturing a display apparatus according to an embodiment of the disclosure.

First, the display module 30 is prepared 501. A plurality of inorganic light emitting diodes 50 are mounted on the mounting surface 41 of the substrate 40 of the display module 30. In order to improve the contrast, the substrate 40 may include the light absorbing layer 60. The substrate 40 may include the anisotropic conductive layer 70 to easily connect the plurality of inorganic light emitting diodes 50 to the substrate 40.

In addition, the black matrix 80 may be formed on the anisotropic conductive layers 70 of the plurality of display modules 30A to 30P.

Next, the front cover 100 is bonded to the mounting surface 41 of the display module 30 502. The front cover 100 may be provided to cover the entire area of the mounting surface 41. The front cover 100 may be formed through a compression hardening process on the mounting surface 41.

Next, the front cover 100 is cut such that at least portion of the front cover 100 extends outside of the substrate 40 in the second direction Y perpendicular to the first direction X facing the mounting surface 41 503.

In detail, the front cover 100 may be cut to form the first region 101 of the front cover 100 outside the mounting surface 41 in the second direction Y.

The cutting process may be performed by laser cutting or the like.

The cutting process may also be performed such that the front cover 100 includes the first region 101 outside the mounting surface 41 in the third direction Z perpendicular to the first direction X and the second direction Y, in addition to the second direction Y.

The front cover 100 may be cut to have the first region 101 extending outward of the four sides of the mounting surface 41.

In the cutting process, the first region 101 extending outside the mounting surface 41 may be processed to have a length smaller than or equal to approximately half of a length of a gap formed between the display modules 30 that may be provided a plurality of display modules 30A to 30P.

Next, the display module 30 processed as the above may be prepared as a plurality of the display modules 30A to 30P, and the plurality of display modules 30A to 30P may be disposed adjacent to each other (504. In this case, the plurality of display modules 30A to 30P may be fixed through a jig. The plurality of display modules 30A to 30P may be arranged in an M×N matrix form.

Accordingly, when the plurality of display modules 30A to 30P are arranged adjacent to each other, the first region 101 of the front cover 100 extending from each of the display modules 30A to 30P may be disposed in the gap G formed between the plurality of display modules 30A to 30P.

Hereinafter, a display apparatus according to another embodiment of the disclosure will be described. Components other than a front cover 100 to be described below are the same, substantially the same, or similar to those of the display apparatus 1 according to the above-described embodiments.

Figure 7:
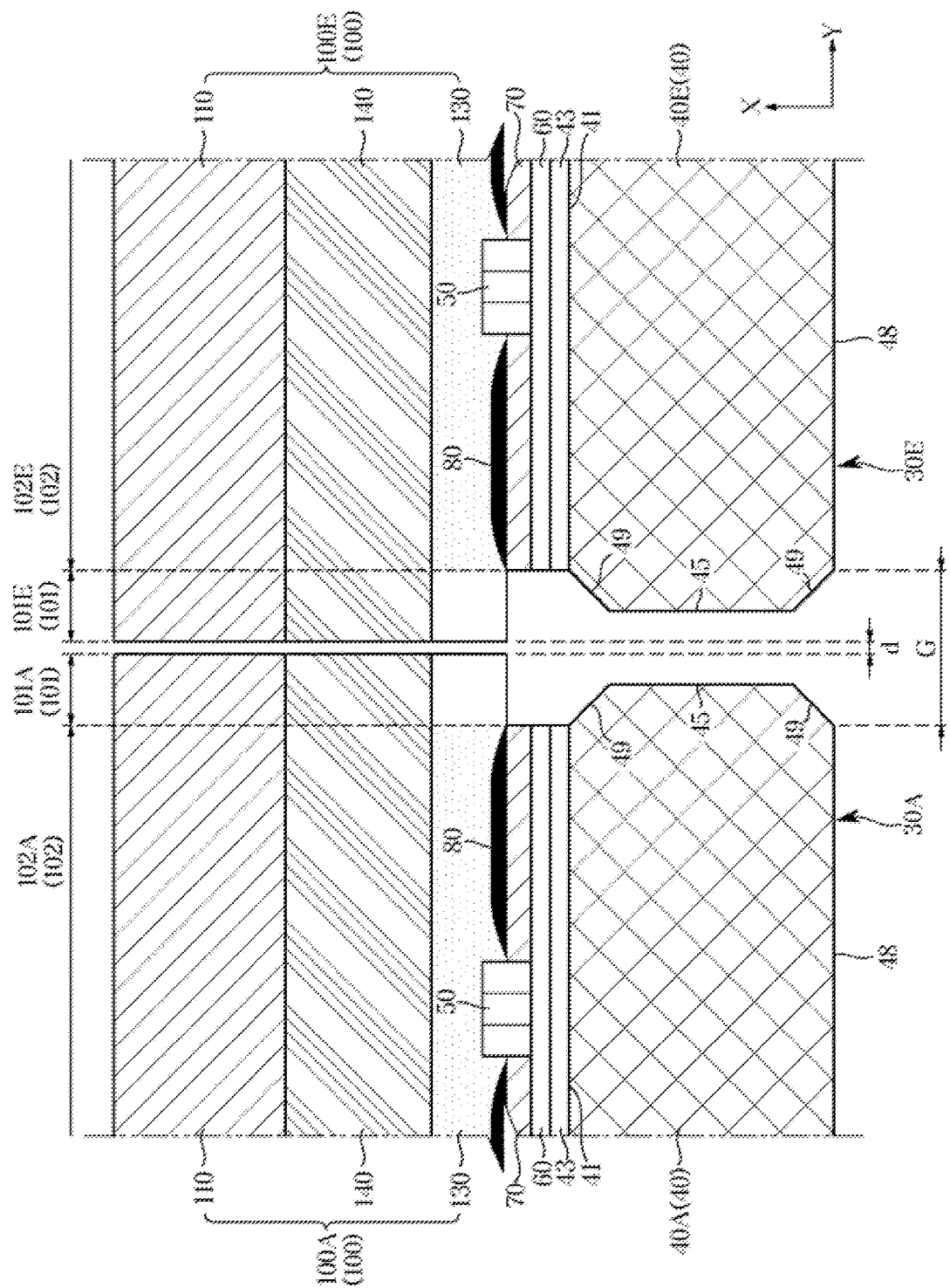
FIG. 7 is an enlarged cross-sectional view illustrating one or more components of a display apparatus according to another embodiment of the disclosure.

FIG. 7 is an enlarged cross-sectional view illustrating one or more components of a display apparatus according to another embodiment of the disclosure.

Referring to FIG. 7, the front cover 100 may include a circular polarization layer 140.

The circular polarization layer 140 is provided to pass only light having a specific phase in the transmitted light and absorb light having the other phase, to reduce the transmittance of light passing through the circular polarization layer 140.

The circular polarization layer 140 may include a linear polarization layer and a circular polarization layer. The linear polarization layer and the circular polarization layer may be sequentially arranged in the first direction X.

In detail, the linear polarization layer and the circular polarizing layer included in the circular polarization layer 140 may change the phase of external light incident from the outside of the display module 20. The circular polarization layer 140 prevents external light having a phase changed while passing through the circular polarization layer 140 that is reflected from the substrate 40 or the gap G and then redirected to the circular polarization layer 140 from passing through the circular polarization layer 140 due to the changed phase.

Accordingly, at least a part of external light incident onto the display module 20 may be absorbed by the circular polarization layer 140 without being reflected to the outside. The circular polarization layer 140 may be provided to pass only light having a specific phase in the transmitted light and absorb light having a phase out of the specific phase.

Accordingly, the circular polarization layer 140 absorbs a part of light transmitted through the circular polarization layer 140 and then reflected from the substrate 40 or the gap G, in particular, the light reflected from the gap G, to thereby lower the revelation of a seam perceived in the gap G.

In the above embodiment, the degree to which light is transmitted through the light transmittance control layer 120 may be adjusted by adjusting the transparency of the material of the light transmittance control layer 120. In contrast, according to one or more embodiments, the degree to which light reflected from the substrate 40 or the gap G is transmitted back to the outside again may be adjusted through the phase difference of light.

As described above, the front cover 100 may be arranged on the gap G in the first direction X.

Accordingly, external light incident onto the display module 20 may pass through the anti-glare layer 110, the circular polarization layer 140, and the adhesive layer 130 to enter the gap G. In this case, the incident light may be prevented from entering the gap G due to the anti-glare layer 110.

In addition, the light reflected from the gap G may be directed to the outside by sequentially passing through the adhesive layer 130, the circular polarization layer 140, and the anti-glare layer 110, and in this case, light transmitted through the circular polarization layer 140 that has a phase out of a specific phase may be absorbed by the circular polarization layer 140 without being transmitted to the outside.

Hereinafter, a display apparatus according to another embodiment of the disclosure will be described. Components other than a front cover 100 to be described below are the same, substantially the same, or similar to those of the display apparatus 1 according to the above-described embodiments.

Figure 8:
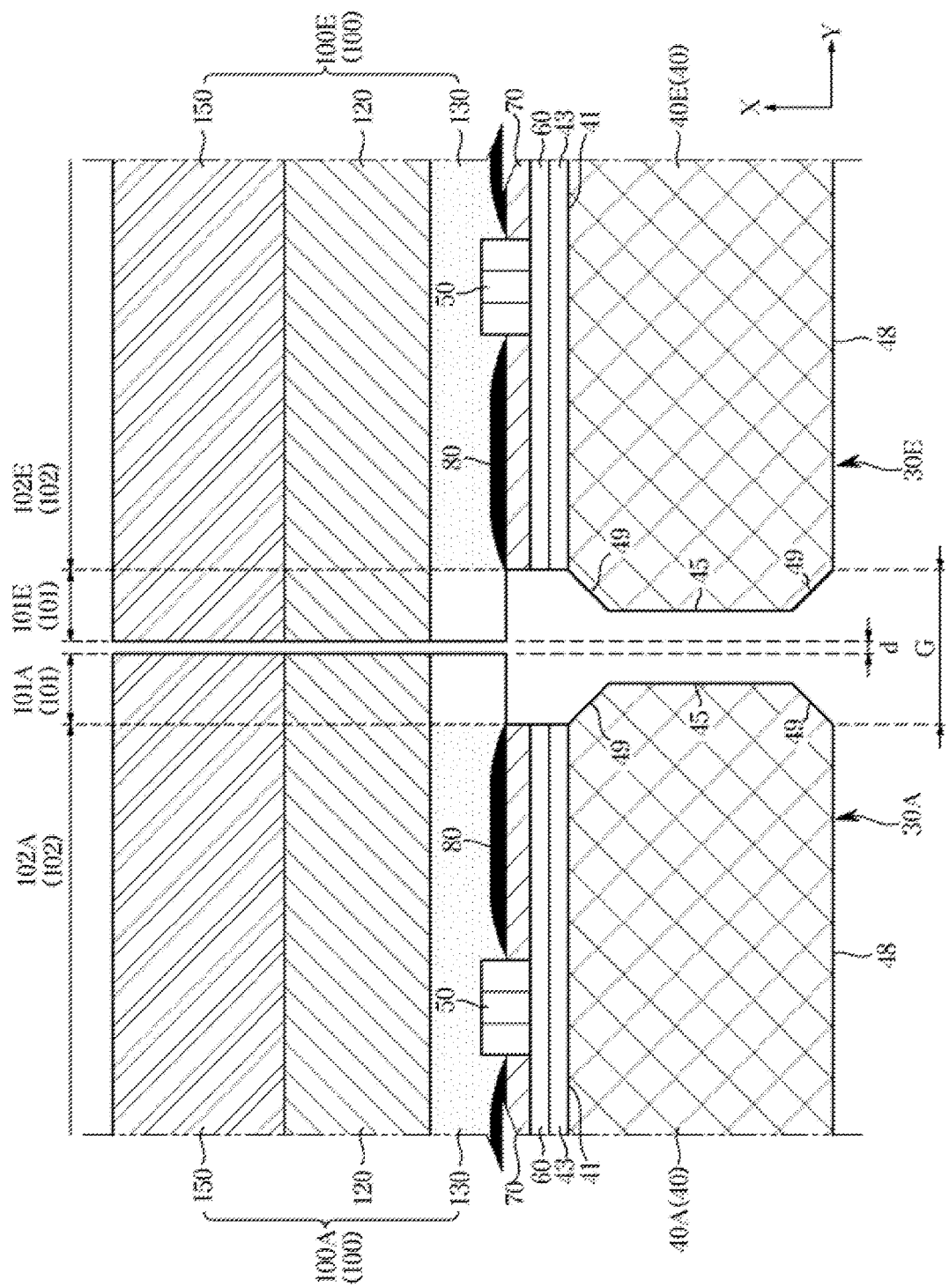
FIG. 8 is an enlarged cross-sectional view illustrating one or more components of a display apparatus according to another embodiment of the disclosure.

FIG. 8 is an enlarged cross-sectional view illustrating one or more components of a display apparatus according to another embodiment of the disclosure.

Referring to FIG. 8, the front cover 100 may include the anti-reflect layer 150.

The anti-reflect layer 150 may reflect external light incident onto the display panel 20 to the outside of the display panel 20 that is not the direction of the substrate 40 or the gap G. Accordingly, the amount of light passing through the anti-reflect layer 150 that is incident onto the gap G may be reduced.

Accordingly, the reflectance of external light incident onto the display panel 20 and directed to the gap G is lowered, thereby improving the sense of unity of the screen of the display module 20.

The anti-reflect layer 150 may include a plurality of layers having different refractive indices. When external light is incident onto the anti-reflect layer 150, the external light may be subject to internal reflection due to the difference in refractive indices of the plurality of layers and thus travel to the outside of the display panel 20 rather than to the substrate 40 or the gap G.

Accordingly, the anti-reflect layer 150 allows only a part of transmitted light to be directed to the substrate 40 or the gap G and absorbs the remaining light, in particular, absorbs a part of the light directed to the gap G, to thereby reduce the revelation of the seam perceived in the gap G and reduce the revelation of the boundary between the plurality of display modules 30A to 30P.

Conversely, the anti-reflect layer 150 may be provided such that light reflected from the gap G or the substrate 40 and incident onto the anti-reflect layer 150 is subject to internal reflection to be prevented from being transmitted in the first direction X. For example, light directed from the gap G in the first direction X is allowed to be transmitted in a direction corresponding to the second direction Y or the third direction Z by the anti-reflect layer 210, so that the reflectance of external light on the display panel 20 is reduced, and revelation of the boundary between the plurality of display modules 30A to 30P is reduced.

Accordingly, only a part of the light reflected from the substrate 40 or the gap G and transmitted to the anti-reflect layer 150 passes through the anti-reflect layer 150, so that the revelation of the seam perceived in the gap G is reduced, and the sense of unity of the screen of the display panel 20 is improved.

In the above embodiment, the reflectance of external light may be adjusted by allowing the external light to be diffusely reflected on the surface of the anti-glare layer 110 of the front cover 100, while in one or more embodiments, the degree of light transmission may be adjusted by adjusting the reflection direction of light through the anti-reflect layer 150.

As described above, the front cover 100 may be disposed in the gap G in the first direction X.

Accordingly, external light incident onto the display module 20 may pass through the anti-reflect layer 150, the light transmittance control layer 120 for adjusting light transmittance, and the adhesive layer 130 to enter the gap G. In this case, at least a part of the incident light may be prevented from entering the gap G due to the anti-reflect layer 150 and the light transmittance control layer 120.

In addition, light reflected from the gap G may be transmitted to the outside by sequentially passing through the adhesive layer 130, the light transmittance control layer 120, and the anti-reflect layer 150, and in this case, a part of the light is prevented from being directed to the front of the display panel 20 due to passing through the light transmittance control layer 120 and the anti-reflect layer 150.

Hereinafter, a display apparatus according to another embodiment of the disclosure will be described. It may be appreciated that components other than a front cover 100 to be described below are the same, substantially the same, or similar to those of the display apparatus 1 according to the above-described embodiments.

Figure 9:
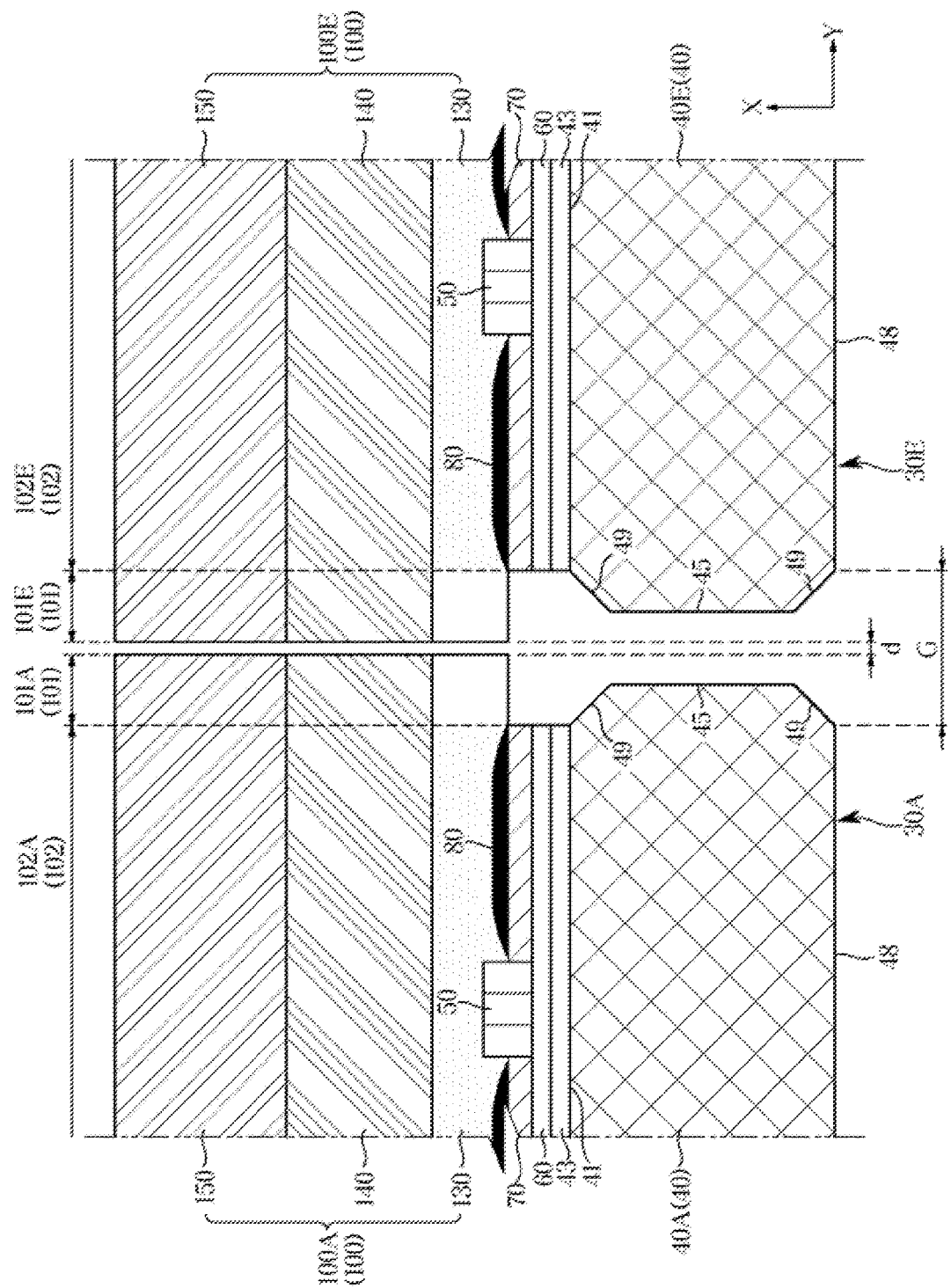
FIG. 9 is an enlarged cross-sectional view illustrating one or more components of a display apparatus according to another embodiment of the disclosure.

FIG. 9 is an enlarged cross-sectional view illustrating one or more components of a display apparatus according to another embodiment of the disclosure.

Referring to FIG. 9, the front cover 100 may include the anti-reflect layer 150 and the circular polarization layer 140.

The anti-reflect layer 150 reflects external light incident onto the display panel 20 to the outside of the display panel 20 that is not the direction of the substrate 40 or the gap G to thereby reduce the amount of external light passing through the anti-reflect layer 150. Accordingly, the reflectance of external light introduced into the display panel 20 and directed to the gap G may be reduced, so that the sense of unity of the screen of the display module 20 may be improved.

The circular polarization layer 140 may be provided to pass only light having a specific phase in the transmitted light and absorb light having a phase out of the specific phase.

Accordingly, only a part of the light transmitted through the anti-reflect layer 150 is transmitted to the substrate 40 or the gap G, and the amount of light, in particular, light directed to the gap G is reduced through internal reflection of the anti-reflect layer 150, to thereby lower the revelation of a seam perceived in the gap G.

Conversely, light reflected from the gap G or the substrate 40 and transmitted to the circular polarization layer 140 and the anti-reflect layer 150 is absorbed by the circular polarization layer 140 or is subject to internal reflection of the anti-reflect layer 150 without being transmitted in the first direction X, so that the reflectance of light reflected from the gap G in the display panel 20 is reduced, and the sense of unity of the screen of the display module 20 may be improved.

As described above, the front cover 100 may be disposed in the gap G in the first direction X.

Accordingly, external light incident onto the display module 20 may pass through the anti-reflect layer 150, the circular polarization layer 140, and the adhesive layer 130 to enter the gap G. The front cover 100 may be provided such that at least a part of the incident light is prevented from entering the gap G using the anti-reflect layer 150.

In addition, light reflected from the gap G may be directed to the outside by sequentially passing through the adhesive layer 130, the circular polarization layer 140, and the anti-reflect layer 150, and in this case, the front cover 100 may be provided to prevent a part of the light from being directed to the front of the display panel 20 due to passing through the circular polarization layer 140 and the anti-reflect layer 150.

Hereinafter, a display apparatus according to another embodiment of the disclosure will be described. Components other than a front cover 100 to be described below are the same, substantially the same, or similar to those of the display apparatus 1 according to the above-described embodiments.

Figure 10:
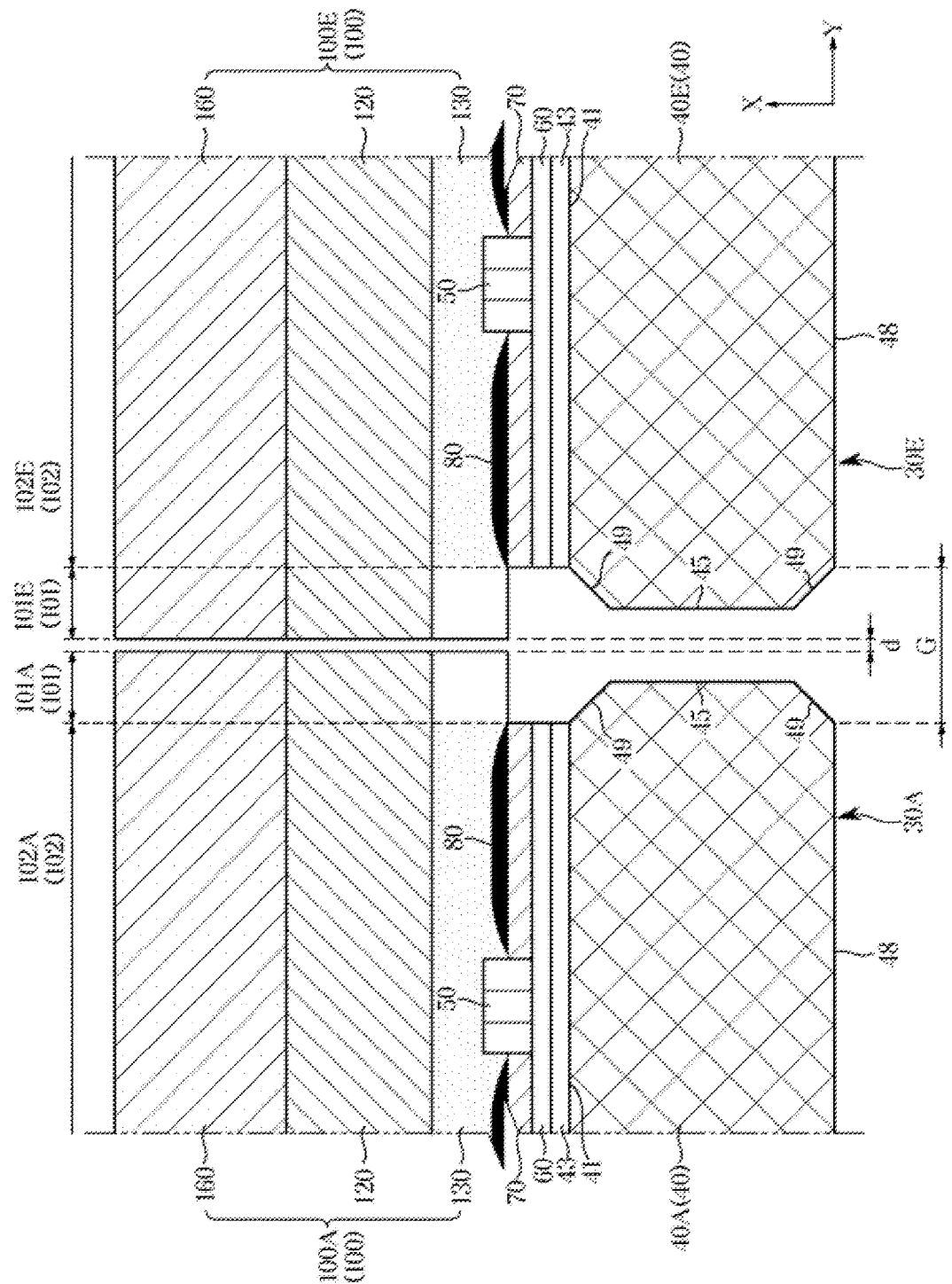
FIG. 10 is an enlarged cross-sectional view illustrating one or more components of a display apparatus according to another embodiment of the disclosure.

FIG. 10 is an enlarged cross-sectional view illustrating one or more components of a display apparatus according to another embodiment of the disclosure.

Referring to FIG. 9, the front cover 100 may include the front layer 160 disposed on the foremost side of the front cover 100.

The front layer 160 may include both the anti-reflect layer and the anti-glare layer described above. The front layer 160 may be configured in a stacked form such that the anti-reflect layer and the anti-glare layer are layered.

The anti-glare layer is provided to diffusely reflect light incident onto the front layer 160 from the outside, and the anti-reflect layer is provided to induce a reflection direction of light such that light incident onto the front layer 160 is reflected to the outside with respect to the first direction X of the display panel 20.

In this way, the front layer 160 may reduce the reflectance of external light incident onto the display panel 20 through the anti-glare layer and the anti-reflect layer.

In an implementation, the anti-glare layer and the anti-reflect reflective layer may be sequentially arranged in the first direction X.

The front cover 100 may include the light transmittance control layer 120 disposed behind the front layer 160.

The light transmittance control layer 120 of the front cover 100 may be provided as a light transmittance control layer configured to reduce the transmittance of light incident from outside or the transmittance of external light reflected from the substrate 40 and the gap G, similar to the light transmittance control layer 120 according to the above embodiment.

The front cover 100 is provided such that only a part of light transmitted through the front layer 160 and the light transmittance control layer 120 is transmitted to the substrate 40 or the gap G.

The front cover 100 is provided such that incident light is diffusely reflected or is subject to internal reflection to be changed in the reflection direction by the front layer 160, and is absorbed by the light transmittance control layer 120 so that the amount of light, in particular, light directed to the gap G is reduced to lower the revelation of a seam perceived in the gap G.

Conversely, the front cover 100 is provided such that at least a part of light reflected from the substrate G and the gap G is prevented from exiting the display panel 20 in the first direction X by passing through the light transmittance control layer 120 and the front layer 160, so that the reflectance of external light, in particular, external light reflected from the gap G is reduced to thereby improve the sense of unity of the screen of the display module 20.

As described above, the front cover 100 may be disposed in the gap G in the first direction X.

Accordingly, external light incident onto the display module 20 may pass through the front layer 160 including the anti-glare layer and the anti-reflect layer, the light transmittance control layer 120 for adjusting the light transmittance, and the adhesive layer 130 to enter the gap G. In this case, at least a part of the incident light may be prevented from entering the gap G due to the front layer 160 and the light transmittance control layer 120.

In addition, light reflected from the gap G may be transmitted to the outside by sequentially passing through the adhesive layer 130, the light transmittance control layer 120, and the front layer 160, and in this case, a part of the light reflected from the gap G is prevented from being directed to the front of the display panel 20 due to passing through the light transmittance control layer 120 and the front layer 160.

Hereinafter, a display apparatus according to another embodiment of the disclosure will be described. Components other than a front cover 100 to be described below are the same, substantially the same, or similar to those of the display apparatus 1 according to the above-described embodiments.

Figure 11:
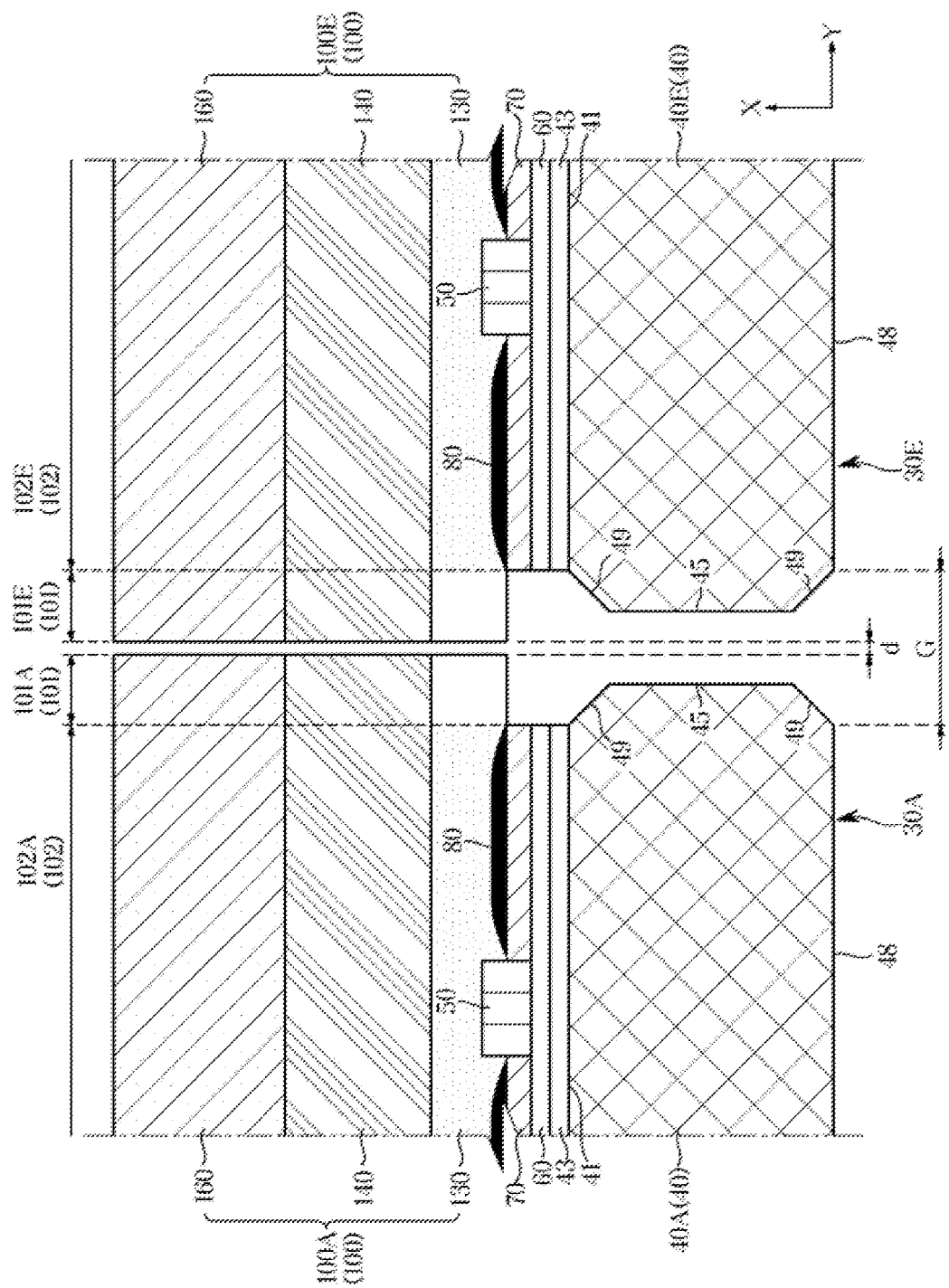
FIG. 11 is an enlarged cross-sectional view illustrating one or more components of a display apparatus according to another embodiment of the disclosure.

FIG. 11 is an enlarged cross-sectional view illustrating one or more components of a display apparatus according to another embodiment of the disclosure.

The front cover 100 may include the front layer 160 and the circular polarization layer 140 disposed behind the front layer 160.

Referring to FIG. 11, the front layer 160 may include both the anti-reflect layer and the anti-glare layer described above, similar to the above described embodiment.

The front layer 160 may reduce the reflectance of external light incident onto the display panel 20 through the anti-glare layer and the anti-reflect layer.

As for light incident onto the circular polarization layer 140 and reflected from the substrate G and the gap G, light having a phase out of a specific phase is prevented from passing through the circular polarization layer 140.

The front cover 100 is provided such that only a part of light transmitted to the front layer 160 is transmitted to the substrate 40 or the gap G.

The front cover 100 is provided such that incident light is diffusely reflected or is subject to internal reflection to be changed in the reflection direction by the front layer 160 and the amount of light, in particular, light directed to the gap G is reduced to lower the revelation of a seam perceived in the gap G.

Conversely, the front cover 100 is provided such that at least a part of light reflected from the substrate G and the gap G is prevented from passing through the display panel 20 in the first direction X by passing through the circular polarization layer 140 and the front layer 160, so that the reflectance of external light, in particular, external light reflected from the gap G is reduced to thereby improve the sense of unity of the screen of the display module 20.

As described above, the adhesive layer 130 and the front cover 100 may be disposed on the gap G in the first direction X.

Accordingly, external light incident onto the display module 20 may pass through the front layer 160 including the anti-glare layer and the anti-reflect layer, the circular polarization layer 140, and the adhesive layer 130 to enter the gap G. In this case, at least a part of the incident light may be prevented from entering the gap G due to the front layer 160.

In addition, light reflected from the gap G may be transmitted to the outside of the display apparatus 1 by sequentially passing through the adhesive layer 130, the circular polarization layer 140, and the front layer 160, and in this case, a part of the light is prevented from being directed to the front of the display panel 20 due to passing through the circular polarization layer 140 and the front layer 160.

Hereinafter, a display apparatus according to another embodiment of the disclosure will be described. Components other than a front cover 100 to be described below are the same, substantially the same, or similar to those of the display apparatus 1.

Figure 12:
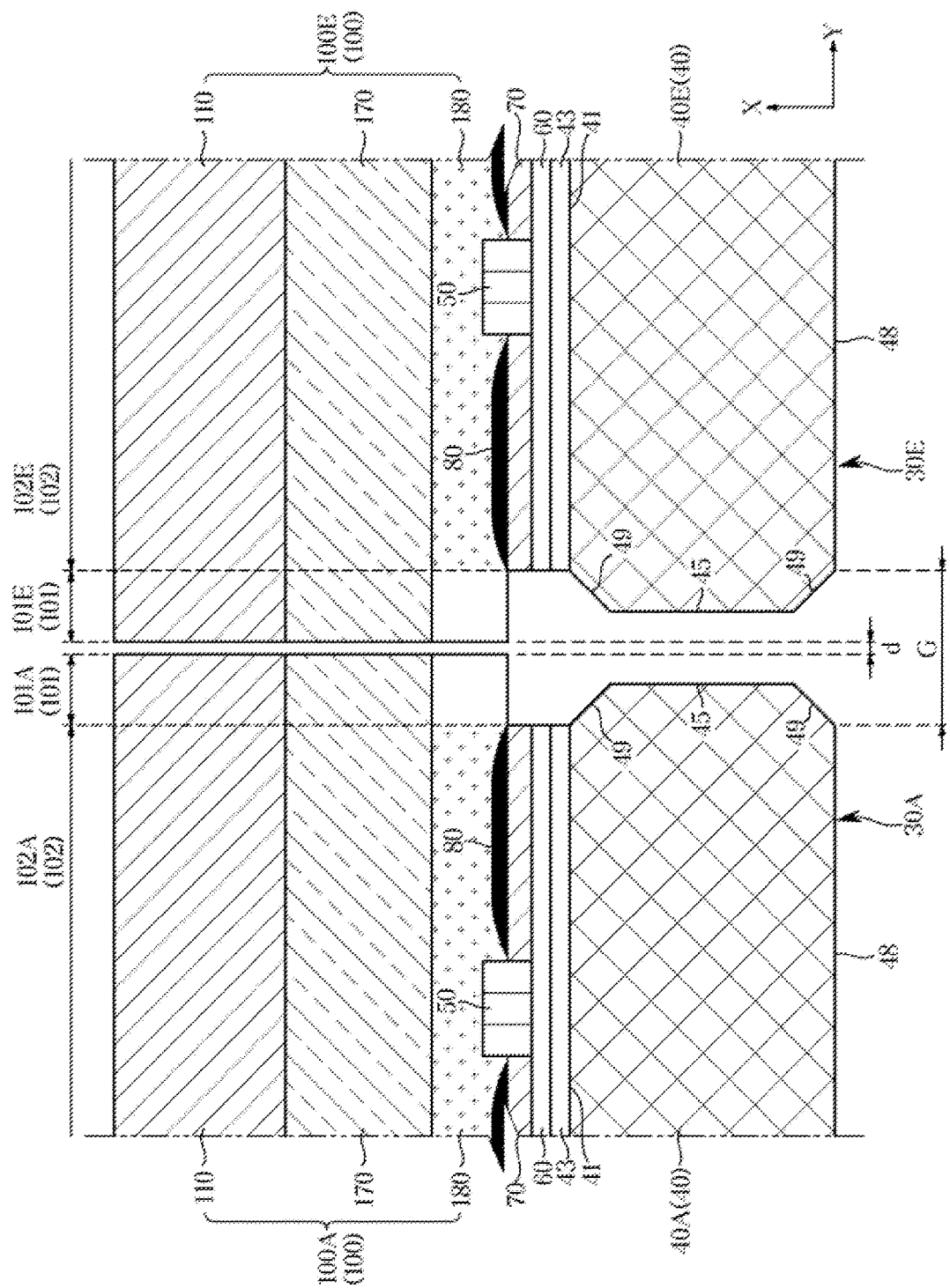
FIG. 12 is an enlarged cross-sectional view illustrating one or more components of a display apparatus according to another embodiment of the disclosure.

FIG. 12 is an enlarged cross-sectional view illustrating one or more components of a display apparatus according to another embodiment of the disclosure.

Referring to FIG. 12, an adhesive layer 180 may be formed of a component different from that of the adhesive layer 130 according to the above embodiment of the disclosure.

In detail, the adhesive layer 180 may be formed of a material capable of absorbing at least a part of light transmitted through the adhesive layer 180.

The adhesive layer 130 according to the above embodiment of the disclosure is formed of a substantially transparent material through which incident light is easily transmitted, while the adhesive layer 180 according to one or more embodiments of the disclosure may be partially opaque so that at least a part of light transmitted through the adhesive layer 180 does not pass through the adhesive layer 180.

The adhesive layer 180 is provided to reduce the transmittance of light incident onto the adhesive layer 180, similar to the light transmittance control layer 120 described above, and serves as a light transmittance control layer.

The front cover 100 may include a transparent layer 170 formed of a transparent material. The transparent layer 170 may be disposed between the anti-glare layer 110 and the adhesive layer 180.

The transparent layer 170 may be in a highly transparent state having a transmittance of 90% or more, such as an optically clear resin (OCR).

This is because the adhesive layer 180 lowers the transmittance of light passing through the display panel 20, further lowering of the transmittance of light may lower the brightness of the screen of the display panel 20 itself.

Accordingly, the transparent layer 170 may be formed of a transparent material through which light incident onto the transparent layer 170 is easily transmitted.

The disclosure is not limited thereto, and the transparent layer 170 may be omitted from the front cover 100.

The front cover 100 is provided such that only a part of light transmitted through the anti-glare layer 110, the transparent layer 170, and the adhesive layer 180 is transmitted to the substrate 40 or the gap G.

With the front cover 100, incident light is diffusely reflected by the anti-glare layer 110 or is absorbed by the adhesive layer 180 so that the amount of light directed to the gap G may be reduced, thereby reducing the revelation of a seam formed in the gap G.

Conversely, with the front cover 100, at least a part of light reflected from the gap G or the substrate 40 is prevented from passing through the display panel 20 in the first direction X by passing through the adhesive layer 180 and the anti-glare layer 120, so that the reflectance of external light, in particular, external light reflected from the gap G in the display panel 20 is reduced, thereby improving the sense of unity of the screen of the display module 20.

As described above, the front cover 100 may be disposed on the gap G in the first direction X.

Accordingly, external light incident onto the display module 20 may pass through the anti-glare layer 110, the transparent layer 170, and the adhesive layer 180 for adjusting the light transmittance, to enter the gap G. In this case, at least a part of the incident light is prevented from entering the gap G due to the anti-glare layer 110 and the adhesive layer 180.

In addition, light reflected from the gap G may be transmitted to the outside by sequentially passing through the adhesive layer 180, the transparent layer 170, and the anti-glare layer 110, and in this case, the light is prevented from being directed to the front of the display panel 20 by passing through the adhesive layer 180 and the anti-glare layer 110.

Hereinafter, a display apparatus according to another embodiment of the disclosure will be described. Components other than a front cover 100 to be described below are the same, substantially the same, or similar to those of the display apparatus 1 according to the above-described embodiments.

Figure 13:
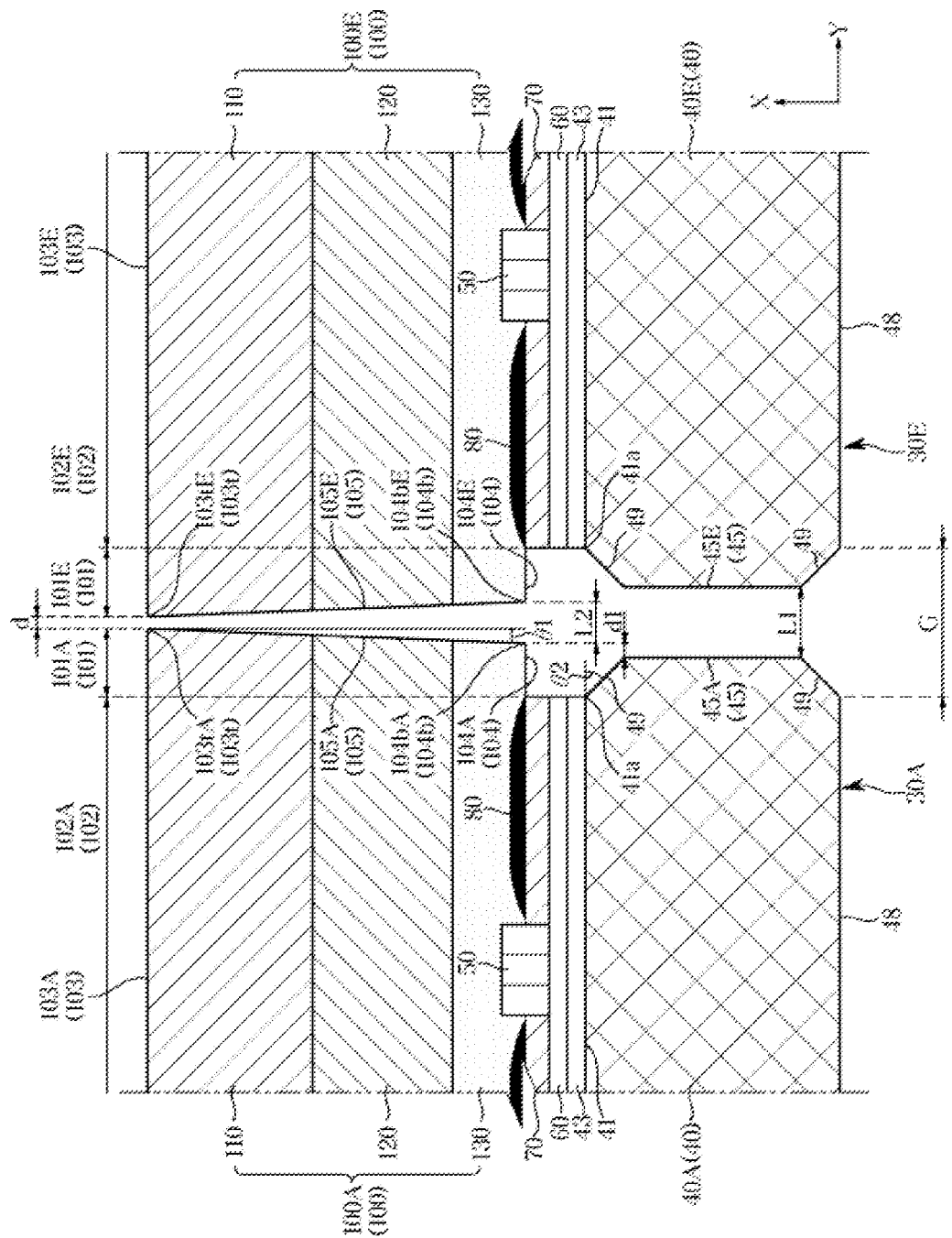
FIG. 13 is an enlarged cross-sectional view illustrating one or more components of a display apparatus according to another embodiment of the disclosure.

FIG. 13 is an enlarged cross-sectional view illustrating one or more components of a display apparatus according to another embodiment of the disclosure.

Referring to FIG. 13, the front cover 100 includes an upper surface 103 disposed on the upper side in the first direction X, a lower surface 104 disposed on the opposite side of the upper surface 103, and a side surface 105 connecting the upper surface 103 to the lower surface 104.

The side surface 105 of the front cover 100 may be formed as an inclined surface inclined with respect to the first direction X.

The side surface 105 may be provided to be inclined so that the upper surface 103 is formed longer than the lower surface 104 in the second direction Y. The side surface 105 of the front cover 100 may be provided such that the length of the cross-section of the front cover 100 increases as being toward the first direction X.

In the front cover 100, light reflected inside the front cover 100 along the extension direction of the front cover 100 may be guided from the side surface 105 of the front cover 100, and the light guided from the side surface 105 may be directed in the first direction X by being reflected through the inclined surface of the side surface 105 without being directed in the second direction Y or the third direction Z, which is the direction in which the light is guided.

Among the light transmitted through the inside of the front cover 100, light moving along the extension direction of the front cover 100 may be allowed to be reflected in the first direction X through the inclined surface of the side surface 105.

The side surface 105 of the front cover 100 is disposed in the gap G, and configured to reflect light inside the front cover 100 such that light, which may leak in the second direction Y or the third direction Z in the gap G, is transmitted in the first direction X.

Accordingly, light leakage that may occur in the lateral direction of the display module 30 is reduced, and revelation of the seam that may be generated by light leakage at the boundary of the plurality of display modules 30A-30P is reduced, so that the sense of unity of the screen of the display panel 20 is improved.

With respect to the second direction Y, one end of the upper surface 103 and one end of the lower surface 104 may be disposed in the gap G. In detail, the one end of the upper surface 103 and the one end of the lower surface 104 may be provided to be disposed outside the mounting surface 41 in the second direction Y.

In addition, the one end of the upper surface 103 and the one end of the lower surface 104 may be provided to be disposed outward of the side surface 45 of the substrate 40 in the second direction Y.

Accordingly, even when the side surface 105 of the front cover 100 is formed to be inclined, the anti-glare layer 110 and the light transmittance control layer 120 may be disposed in the first region 101 of the front cover 100.

Accordingly, the anti-glare layer 110 and the light transmittance control layer 120 are disposed in the gap G between the plurality of display modules 30A-30P, and the revelation of a seam, which may be formed by the gap G of a boundary between the plurality of display modules 30A to 30P, is reduced and the sense of unity of the display panel 20 is improved.

In detail, the distance L2 between one end 104bA of a lower surface 104A of the first front cover 100A of the first display module 30A and one end 104bE of a lower surface 104E of the second front cover 100E of the second display module 30E in the second direction Y is shorter than the distance L1 between a side surface 45A of the first display module 30A and a side surface 45E of the second display module 30E.

In addition, the distance L2 between the one end 104bA of the lower surface 104A of the first front cover 100A of the first display module 30A and the one end 104bE of the lower surface 104E of the second front cover 100E of the second display module 30E in the second direction Y is shorter than the length of the gap G formed between the first display module 30A and the second display module 30E in the second direction Y.

In addition, the distance d between one end 103tA of an upper surface 103A of the first front cover 100A of the first display module 30A and one end 103tE of an upper surface 103E of the second front cover 100E of the second display module 30E in the second direction Y is shorter than the distance L2 between the one end 104bA of the lower surface 104A of the first front cover 100A of the first display module 30A and the one end 104bE of the lower surface 104E of the second front cover 100E of the second display module 30E in the second direction Y.

The distance between a side surface 105A of the first front cover 100A of the first display module 30A and a side surface 105E of the second front cover 100E of the second display module 30E is provided to decrease in the first direction X.

With such a configuration, the side surface 105A of the first front cover 100A and the side surface 105E of the second front cover 100E are disposed in the gap G between the first display module 30A and the second display module 30E, so that the first region 101 of the front cover 100 capable of absorbing external light may be sufficiently disposed in the gap G.

When the one end of the upper surface 103 of the front cover 100 and the one end of the lower surface 104 are provided to be disposed outside the mounting surface 41 in the second direction Y, and the one end of the upper surface 103 of the front cover 100 and the one end of the lower surface 104 are disposed outward of the side surface 45 of the substrate 40 in the second direction Y so that the side surface 105 of the front cover 100 may be provided to be inclined at a predetermined angle 81.

When the one end of the lower surface 104 of the front cover 100 is not disposed in the gap G in the second direction Y, but is disposed on the mounting surface 41, the inclination angle θ1 of the side surface 105 θ1 may be formed large. In this case, the first region 101 of the front cover 100 may not be sufficiently disposed in the gap G, and the rigidity of the side surface 105 of the front cover 100 may be reduced.

Accordingly, the inclination angle 81 of the side surface 105 may be set to an angle at which the one end of the lower surface 104 of the front cover 100 is disposed outside of the mounting surface 41 in the second direction Y.

The inclination angle 81 of the side surface 105 may be formed to be smaller than an inclination angle 82 of the chamfer portion 49. The inclination angle 82 of the chamfer portion 49 may be preferably set to about 45°, and the inclination angle 81 of the side surface 105 may be formed to be less than about 45°.

Hereinafter, a display apparatus according to another embodiment of the disclosure will be described. Components other than a front cover 100 to be described below are the same, substantially the same, or similar to those of the display apparatus 1 according to the above-described embodiments.

Figure 14:
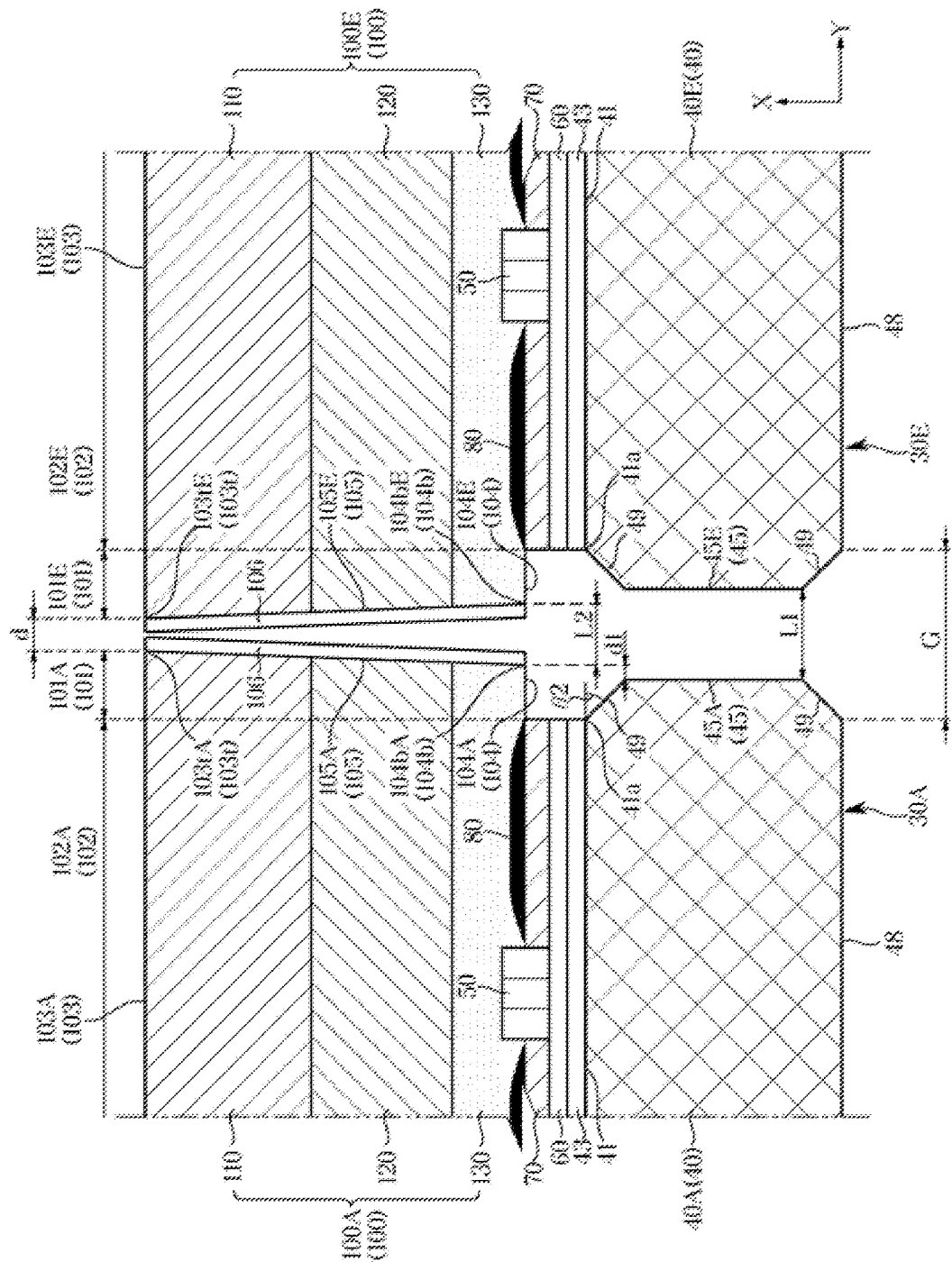
FIG. 14 is an enlarged cross-sectional view illustrating one or more components of a display apparatus according to another embodiment of the disclosure.

FIG. 14 is an enlarged cross-sectional view illustrating one or more components of a display apparatus according to another embodiment of the disclosure The front cover 100 may include a light absorbing portion 106 disposed on the side surface 105 formed to be inclined. In detail, the light absorbing portion 106 may be bonded the side surface 105 from the outside of the side surface 105 in the second direction Y.

The light absorbing portion 106 may be disposed on the gap G in the second direction Y and may be provided to absorb at least a part of light transmitted to the outside through the side surface 105 of the front cover 100. The light absorbing portion 106 may reduce light leakage that may occur from the side surface 105 of the front cover 100.

As described above, the side surface 105 is disposed in an inclined manner to allow at least a part of the light guided from the side surface 105 to be reflected in the first direction X. Light not reflected by the inclined surface of the side surface 105 may pass through the side surface 105 and exit to the outside.

The light absorbing portion 106 absorbs a part of the light passing through the side surface 105 as such, so that the light leakage generated in the gap G is reduced and the revelation of a seam, which may be formed by the gap G of a boundary between the plurality of display modules 30A to 30P, is reduced and the sense of unity of the display panel 20 is improved.

As is apparent from the above, the display apparatus according to one or more embodiments absorbs light incident onto or reflected from a gap between display modules adjacent to each other, thereby providing a seamless effect that a seam is prevented from being visually perceived.

The display apparatus according to one or more embodiments of the disclosure includes a plurality of display modules that individually include components configured to absorb light incident onto or reflected from a gap between adjacent display modules, thereby easily and efficiently implementing the seamless effect even when assembled.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A display module comprising:
    a substrate comprising a mounting surface, a side surface, and a chamfer portion formed between the mounting surface and the side surface;
    a plurality of inorganic light emitting diodes mounted on the mounting surface, the plurality of inorganic light emitting diodes comprising a plurality of pairs of electrodes electrically connected to the substrate, the plurality of pairs of electrodes disposed in a direction opposite to a direction in which the plurality of inorganic light emitting diodes emits light;
    a black matrix arranged between the plurality of inorganic light emitting diodes; and
    a cover bonded to the mounting surface and configured to cover the mounting surface, the cover provided to extend outward of the side surface in an extension direction of the mounting surface,
    wherein the cover comprises:
        a first region arranged outside of the mounting surface in the extension direction of the mounting surface, and
        a second region arranged on the mounting surface.

2. The display module of claim 1, wherein the cover comprises:
    a first layer at an outermost side of the display module in a direction in which the mounting surface faces,
    a second layer arranged behind the first layer, and
    an adhesive layer arranged behind the second layer to bond the cover to the mounting surface.

3. The display module of claim 2, wherein the first layer comprises at least one of an anti-glare layer or an anti-reflect layer.

4. The display module of claim 2, wherein the second layer comprises a light transmission control layer configured to lower a light transmittance.

5. The display module of claim 2, wherein the second layer comprises a circular polarization layer.

6. The display module of claim 2, wherein the second layer is formed to be transparent, and wherein the adhesive layer comprises an opaque material to lower a light transmittance.

7. The display module of claim 1, wherein an outermost end of the cover in the extension direction of the mounting surface comprises:
an inclined surface inclined with respect to the side surface, and
a length of a cross section of an upper side of the cover in a direction in which the mounting surface faces is larger than a length of a cross section of a lower side of the cover in the direction in which the mounting surface faces.

8. The display module of claim 7, wherein the cover further comprises a light absorbing layer configured to cover the inclined surface of the outermost end of the cover in the extension direction of the mounting surface and comprising a light absorbing material.

9. The display module of claim 1, wherein the side surfaces are provided to correspond to four edges of the mounting surface, and
wherein the cover is provided to extend outward of the four side surfaces corresponding to the four edges of the mounting surface in the extension direction of the mounting surface.

10. The display module of claim 1, wherein each of the inorganic light emitting diodes is provided as a light emitting diode flip chip.

11. The display module of claim 1, wherein each of the inorganic light emitting diodes comprises:
a light emitting surface formed in the direction in which the mounting surface faces and a bottom surface formed at a side opposite to the light emitting surface, and
the plurality of pairs of electrodes are arranged on the bottom surface.

12. A display apparatus comprising a display module array in which a plurality of display modules are arranged in a M×N matrix, wherein each of the plurality of display modules comprises:
a substrate comprising a mounting surface, a side surface, and a chamfer portion formed between the mounting surface and the side surface, the side surfaces are provided to correspond to four edges of the mounting surface;
a plurality of inorganic light emitting diodes mounted on the mounting surface, the plurality of inorganic light emitting diodes comprising a plurality of pairs of electrodes electrically connected to the substrate;
a black matrix arranged between the plurality of inorganic light emitting diodes; and
a cover bonded to the mounting surface and configured to cover the mounting surface,
wherein the plurality of pairs of electrodes are disposed in a direction opposite to a direction in which the plurality of inorganic light emitting diodes emits light, and
wherein the cover is provided to extend outward of the four side surfaces corresponding to the four edges of the mounting surface in an extension direction of the mounting surface such that at least a portion of the cover is arranged between a gap formed between the plurality of display modules.

13. The display apparatus of claim 12, wherein the plurality of display modules comprise a first display module and a second display module arranged adjacent to the first display module, and
wherein a length of the gap in the extension direction of the mounting surface is provided to be larger than a length of a separation between a cover of the first display module and a cover of the second display module.

14. The display apparatus of claim 13, wherein outermost ends of the covers of the first display module and the second display module in a direction in which the first display module and the second display module are adjacent to each other are formed as inclined surfaces inclined with respect to the side surfaces of the first and second display modules, and
wherein a separation distance in the extension direction of the mounting surface between an upper side of the cover of the first display module in a direction in which the mounting surface faces and an upper side of the cover of the second display module in the direction in which the mounting surface faces is shorter than a separation distance in the extension direction of the mounting surface between a lower side of the cover of the first display module in the direction in which the mounting surface faces and a lower side of the cover of the second display module in the direction in which the mounting surface faces.

15. The display apparatus of claim 14, wherein the separation distance in the extension direction of the mounting surface between the lower side of the cover of the first display module in the direction in which the mounting surface faces and the lower side of the cover of the second display module in the direction in which the mounting surface faces is shorter than a distance of the gap between the first display module and the second display module in the extension direction of the mounting surface.

16. The display apparatus of claim 14, wherein the inclined surfaces of the covers of the first and second display modules have an inclination angle smaller than an inclination angle of the chamfer portions of the first and second display modules.

17. The display apparatus of claim 12, wherein the cover comprises:
a first layer arranged at an outermost side of the display module in a direction in which the mounting surface faces and comprising at least one of an anti-glare layer or an anti-reflect layer;
a second layer arranged behind the first layer; and
an adhesive layer arranged behind the second layer to bond the cover to the mounting surface.

18. The display module of claim 12, wherein each of the inorganic light emitting diodes comprises a light emitting surface formed in the direction in which the mounting surface faces and a bottom surface formed at a side opposite to the light emitting surface, and
wherein the pair of electrodes are arranged on the bottom surface.

\* \* \* \* \*